United States Patent [19]

Bowen et al.

[11] 4,012,625
[45] Mar. 15, 1977

[54] NON-LOGIC PRINTED WIRING BOARD TEST SYSTEM

[75] Inventors: Russell H. Bowen, Seminole; Allen L. Clark, Odessa; David C. Davis, Clearwater; Walter E. Gilbert, Largo; Wayne L. Glover, Odessa; Richard J. Walsh, Brooksville; Robert G. Wehling, Tampa, all of Fla.

[73] Assignee: Honeywell Information Systems, Inc., Waltham, Mass.

[22] Filed: Sept. 5, 1975

[21] Appl. No.: 610,581

[52] U.S. Cl. .................. 235/153 AC; 324/73 R
[51] Int. Cl.² .......................................... G01R 31/00
[58] Field of Search .......... 235/153 AC; 340/172.5; 324/73 R, 73 AT, 73 PC, 158 F, 158 P

[56] References Cited
UNITED STATES PATENTS

| | | | |
|---|---|---|---|
| 3,631,229 | 12/1971 | Bens et al. .................. | 235/173 AC |
| 3,739,160 | 6/1973 | El-Hasan et al. ............ | 235/153 AC |
| 3,764,995 | 10/1973 | Helf, Jr. et al. ............. | 235/153 AC |
| 3,777,129 | 12/1973 | Mehta ......................... | 235/153 AC |
| 3,851,249 | 11/1974 | Roch ............................ | 324/158 F |
| 3,931,506 | 1/1976 | Borrelli et al . ............. | 235/153 AC |

OTHER PUBLICATIONS

B394,712 Jan. 1, 1975, Patti, 324/73 R.
Gerhard & Perdick, Computerized Testing of Thin-Film Circuit Conductors, Solid State Technology/Sept. 1971, pp. 41–46.

Primary Examiner—Charles E. Atkinson
Attorney, Agent, or Firm—Nicholas Prasinos; Ronald T. Reiling

[57] ABSTRACT

An automatic printed circuit board tester to test printed circuit boards and diagnose faults in digital and analog electrical circuit networks is disclosed. The system is comprised of control, stimuli, and interconnection networks in combination with measuring instrumentation. For automated fault isolation, a moving probe assembly driven by stepping motors controlled by a minicomputer is utilized. The fault isolation system establishes a fault path from an output pin to a terminal point within the network. The location of the terminal point together with a directed graph is utilized to select branches that could cause the failure.

20 Claims, 38 Drawing Figures

DIRECTED GRAPH OF NETWORK

REDUCED DIRECTED GRAPH

| FROM NODE | VIA BRANCH | TO NODE | 1 | 2 | 3 | 4 | 5 | 6 | 7 | 8 | 9 | 10 | 11 | 12 | TERMINATES |
|---|---|---|---|---|---|---|---|---|---|---|---|---|---|---|---|
| ① | R52 | 2 |  | Ⓧ |  |  |  |  |  |  |  |  |  |  | ✓ |
| 1 | R53 OR U8 | ③ |  | Ⓧ |  |  |  |  |  |  |  |  |  |  |  |
| 3 | R55 | 5 |  |  | X |  |  |  |  |  |  |  |  |  | ✓ |
| 3 | R54 | 6 |  |  | X |  |  |  |  |  |  |  |  |  |  |
| 6 | Q8 | 10 |  |  |  | X |  |  |  |  |  |  |  |  |  |
| 10 | Q9 | ⑪ |  |  |  |  | Ⓧ |  |  |  |  |  |  |  |  |
| 11 | C14 | 14 |  |  |  |  |  | X |  |  |  |  |  |  |  |
| 14 | R18 | 5 |  |  |  |  |  |  | X |  |  |  |  |  | ✓ |
| 11 | Q2 | 13 |  |  |  |  |  | X |  |  |  |  |  |  |  |
| 13 | CR2 | 17 |  |  |  |  |  |  | X |  |  |  |  |  |  |
| 17 | VR3 | 7 |  |  |  |  |  |  |  | X |  |  |  |  | ✓ |
| 13 | R22 | ⑱ |  |  |  |  |  |  | Ⓧ |  |  |  |  |  |  |
| 18 | U6 | ㉗ |  |  |  |  |  |  |  | Ⓧ |  |  |  |  |  |
| 27 | R47 | 7 |  |  |  |  |  |  |  |  | X |  |  |  | ✓ |
| 27 | R73 | 5 |  |  |  |  |  |  |  |  | X |  |  |  | ✓ |
| 18 | U6 | ㉑ |  |  |  |  |  |  |  | Ⓧ |  |  |  |  |  |
| 21 | R60 | 5 |  |  |  |  |  |  |  |  | X |  |  |  | ✓ |
| 21 | R49 | ㉓ |  |  |  |  |  |  |  |  | Ⓧ |  |  |  | ✓ |
| 21 | Q11 | ㉔ |  |  |  |  |  |  |  |  | Ⓧ |  |  |  |  |
| 24 | R23 | 9 |  |  |  |  |  |  |  |  |  | X |  |  | ✓ |
| 24 | R59 | ㉖ |  |  |  |  |  |  |  |  |  | Ⓧ |  |  | ✓ |
| 21 | Q11 | 22 |  |  |  |  |  |  |  |  | X |  |  |  |  |
| 22 | R67 | 25 |  |  |  |  |  |  |  |  |  | X |  |  |  |
| 25 | R66 | 9 |  |  |  |  |  |  |  |  |  |  | X |  | ✓ |
| 11 | Q2 | 12 |  |  |  |  | X |  |  |  |  |  |  |  |  |
| 12 | R19 | 7 |  |  |  |  |  |  | X |  |  |  |  |  | ✓ |
| 11 | Q7 | 16 |  |  |  |  |  | X |  |  |  |  |  |  |  |
| 16 | R39 | 20 |  |  |  |  |  |  | X |  |  |  |  |  | ✓ |
| 11 | Q7 | 15 |  |  |  |  |  | X |  |  |  |  |  |  |  |
| 15 | R21 | 18 |  |  |  |  |  |  | X |  |  |  |  |  | ✓ |
| 15 | CR1 | 19 |  |  |  |  |  |  | X |  |  |  |  |  |  |
| 19 | VR2 | 20 |  |  |  |  |  |  |  | X |  |  |  |  | ✓ |
| 10 | Q9 | 9 |  |  |  |  | X |  |  |  |  |  |  |  | ✓ |
| 6 | Q8 | 9 |  |  |  | X |  |  |  |  |  |  |  |  | ✓ |
| 6 | R46 | 8 |  |  |  | X |  |  |  |  |  |  |  |  | ✓ |
| 1 | U8 | ④ | Ⓧ |  |  |  |  |  |  |  |  |  |  |  |  |
| 4 | R57 | 5 |  |  | X |  |  |  |  |  |  |  |  |  | ✓ |
| 4 | R56 | 7 |  |  | X |  |  |  |  |  |  |  |  |  | ✓ |

INTERCONNECT FILE

*Fig. 4.*

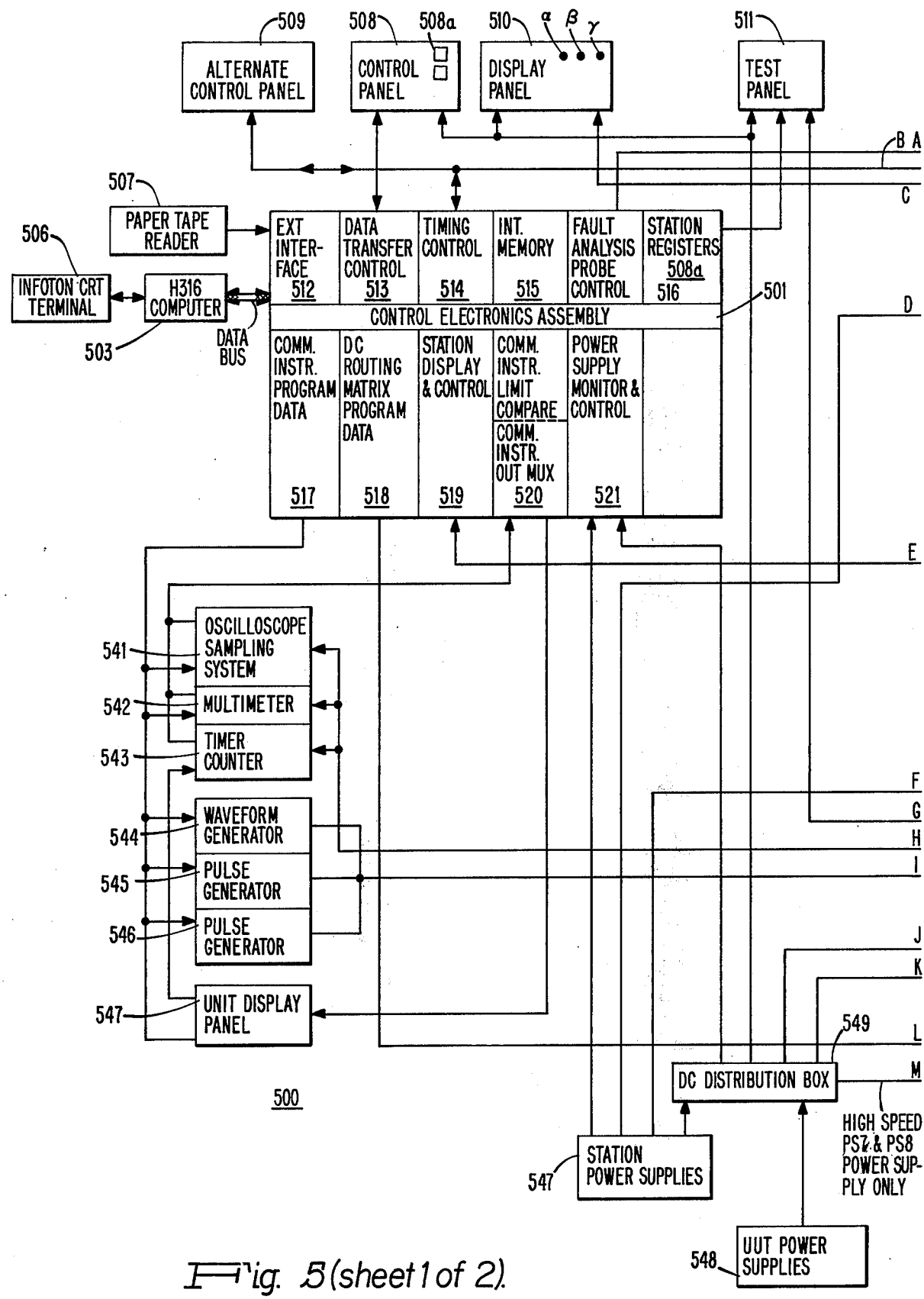
Fig. 5 (sheet 1 of 2).

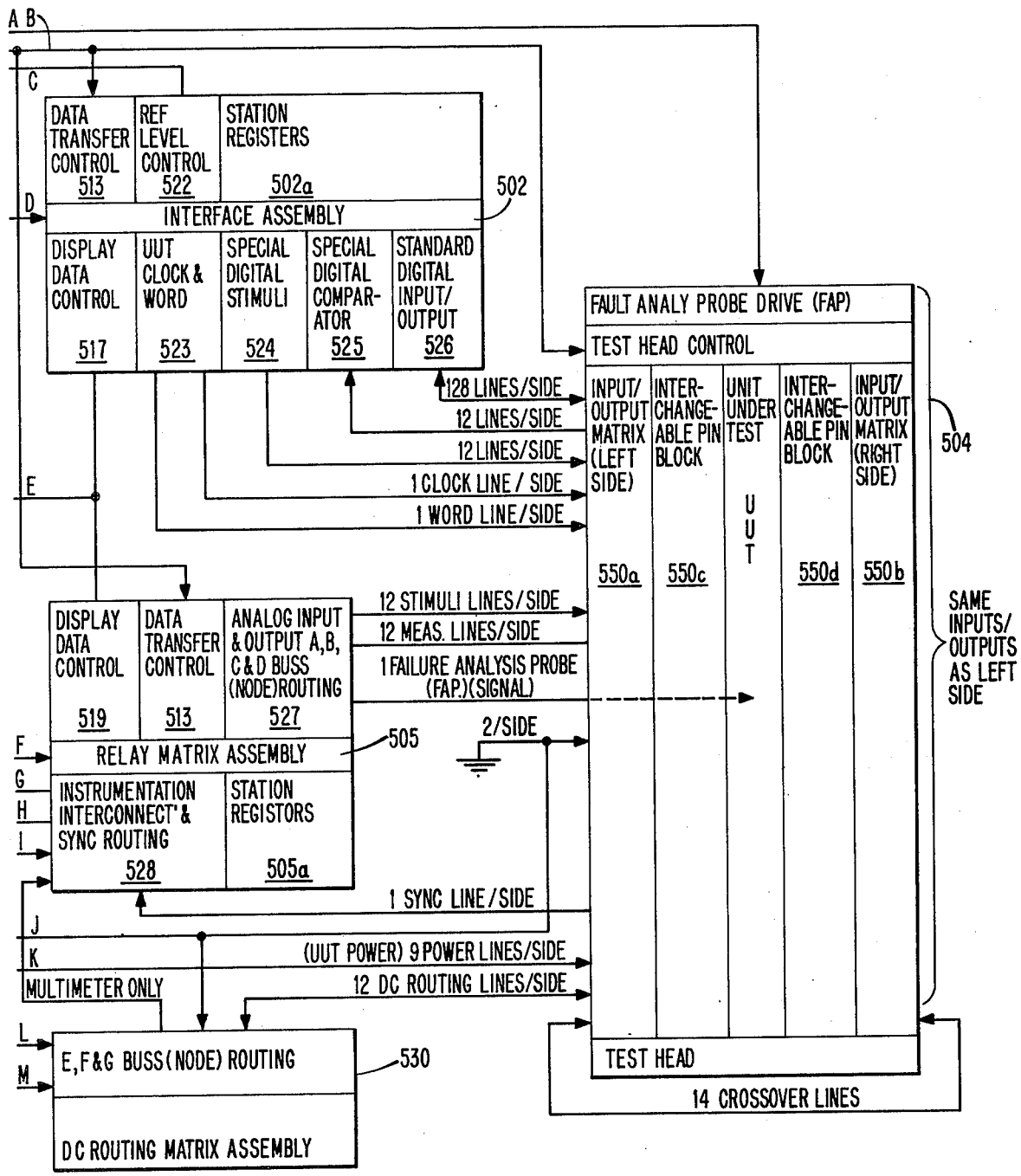
Fig. 5(sheet 2 of 2).

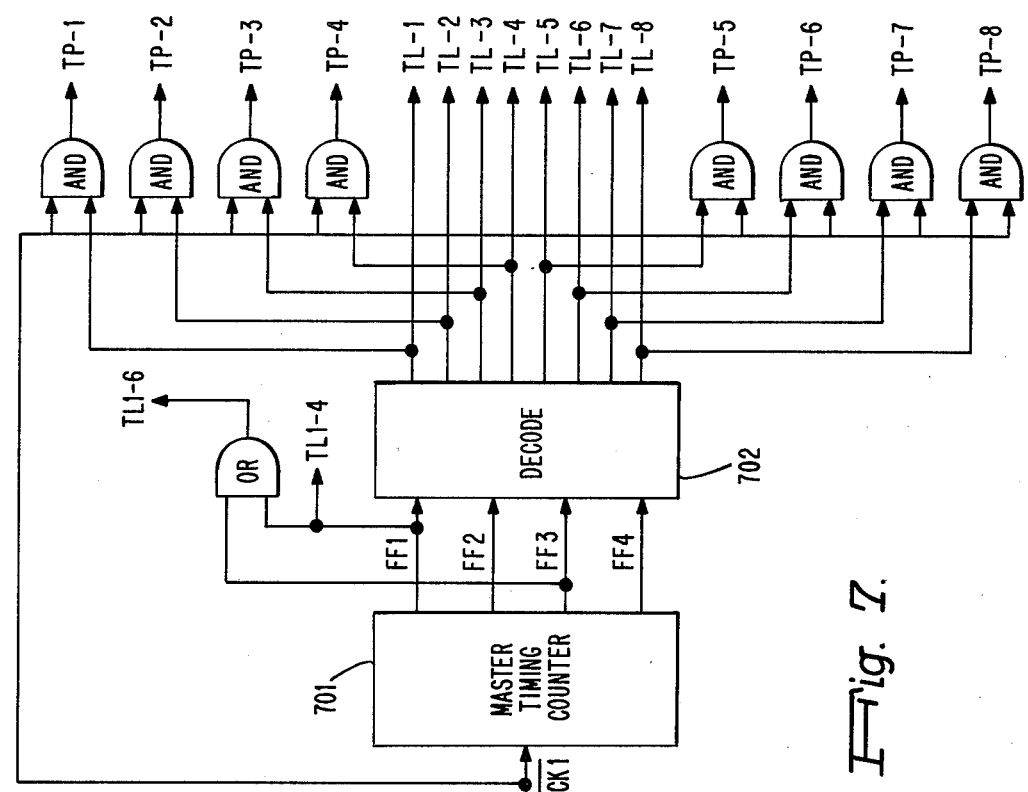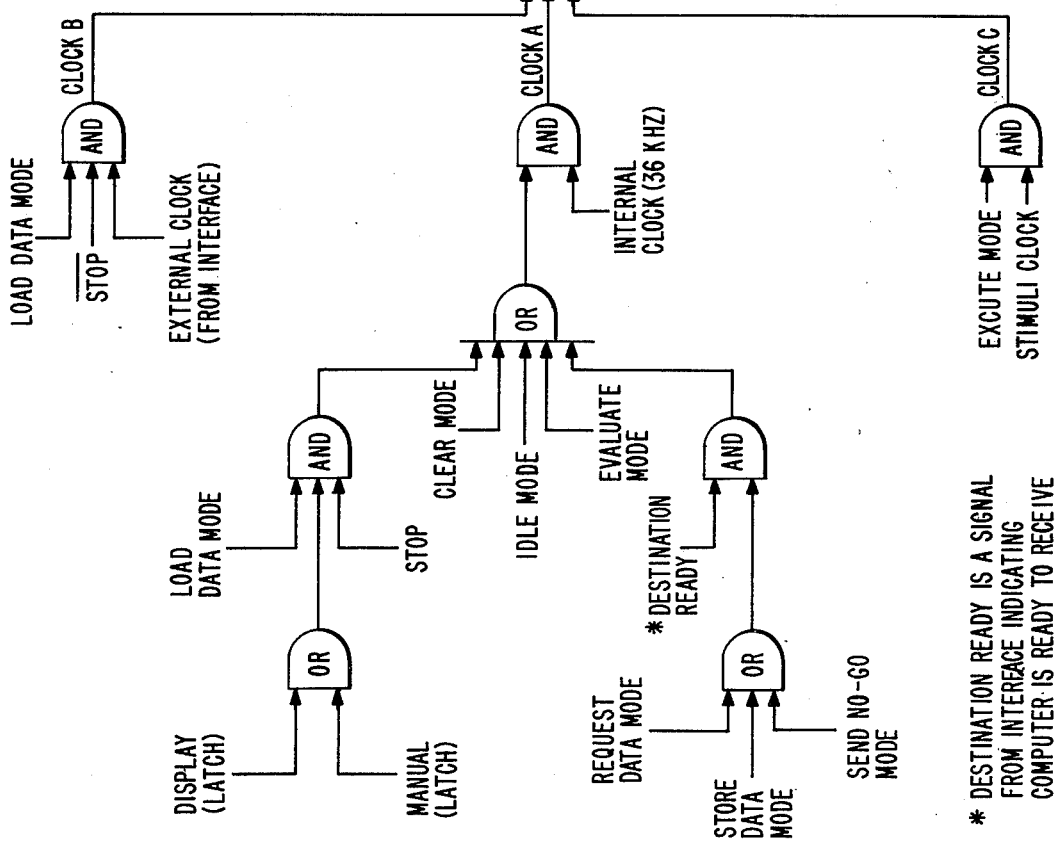
Fig. 7.

| GROUP/LINE ASSIGNMENTS | | |
|---|---|---|
| GROUP | LINE | DATA FUNCTION |
| 00 | 20 | TEST NUMBER DISPLAY |
| 01 | 00-77 | 8 DATA BITS FOR EACH OF I/O LINES 0-63 |
| 02 | 00-77 | 8 DATA BITS FOR EACH OF I/O LINES 64-127 |
| 03 | 00-67 | 8 DATA BITS FOR EACH OF I/O LINES 128-183 |
| 04 | 00-55 | OUTPUT STATE SPECIFICATION FOR I/O LINES 0-183 |
| 04 | 56-77 | GENERAL OPERATING FUNCTIONS |
| 05 | 00-43 | ENABLE I/O LINES AS INPUTS ON LINES 0-279 |
| 05 | 44-77 | GENERAL OPERATING FUNCTIONS (NOT ALL ARE USED) |
| 06 | 00-77 | 8 DATA BITS FOR EACH OF I/O LINES 184-247 |
| 07 | 00-77 | COMMERCIAL INSTR. PROGRAM AND MATRIX ROUTING |
| 10 | 00-77 | COMM. INSTR. PROGRAM/MATRIX ROUTING/DIG. COMPARATORS/PS 3,4,7&8 PROGRAM |
| 11 | 00-10 | FAILURE ANALYSIS PROBE |
| 11 | 11-77 | NOT USED |
| 12 | 00-77 | NOT USED |
| 13 | 00-77 | NOT USED |
| 14 | 00-27 | OUTPUT STATE SPECIFICATION FOR I/O LINES 184-279 |
| 14 | 28-77 | NOT USED |
| 15 | 00-77 | NOT USED |
| 16 | 00-37 | 8 DATA BITS FOR EACH OF I/O LINES 248-279 |
| 16 | 38-77 | NOT USED |
| 17 | 00-77 | NOT USED |

Fig. 13.

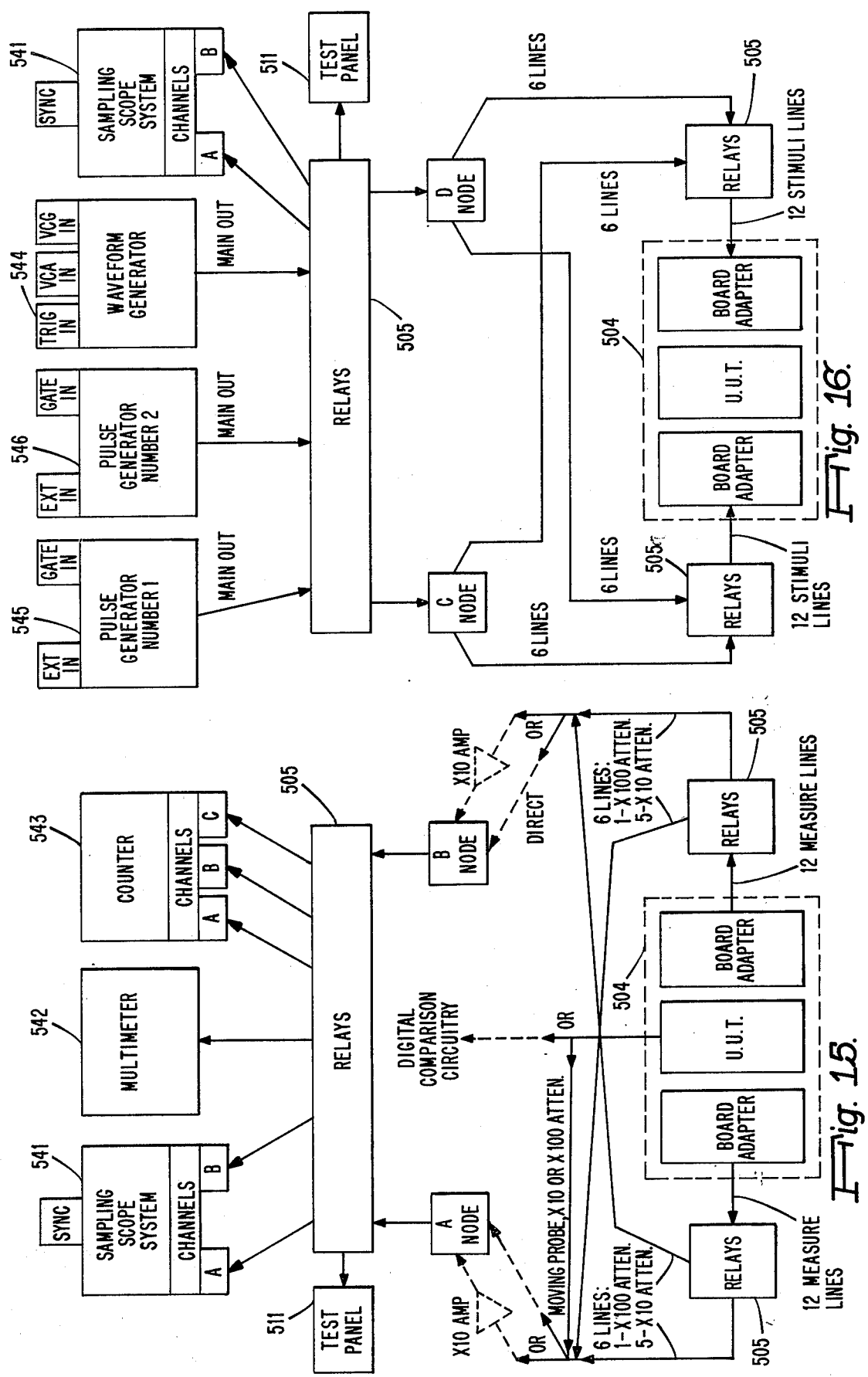

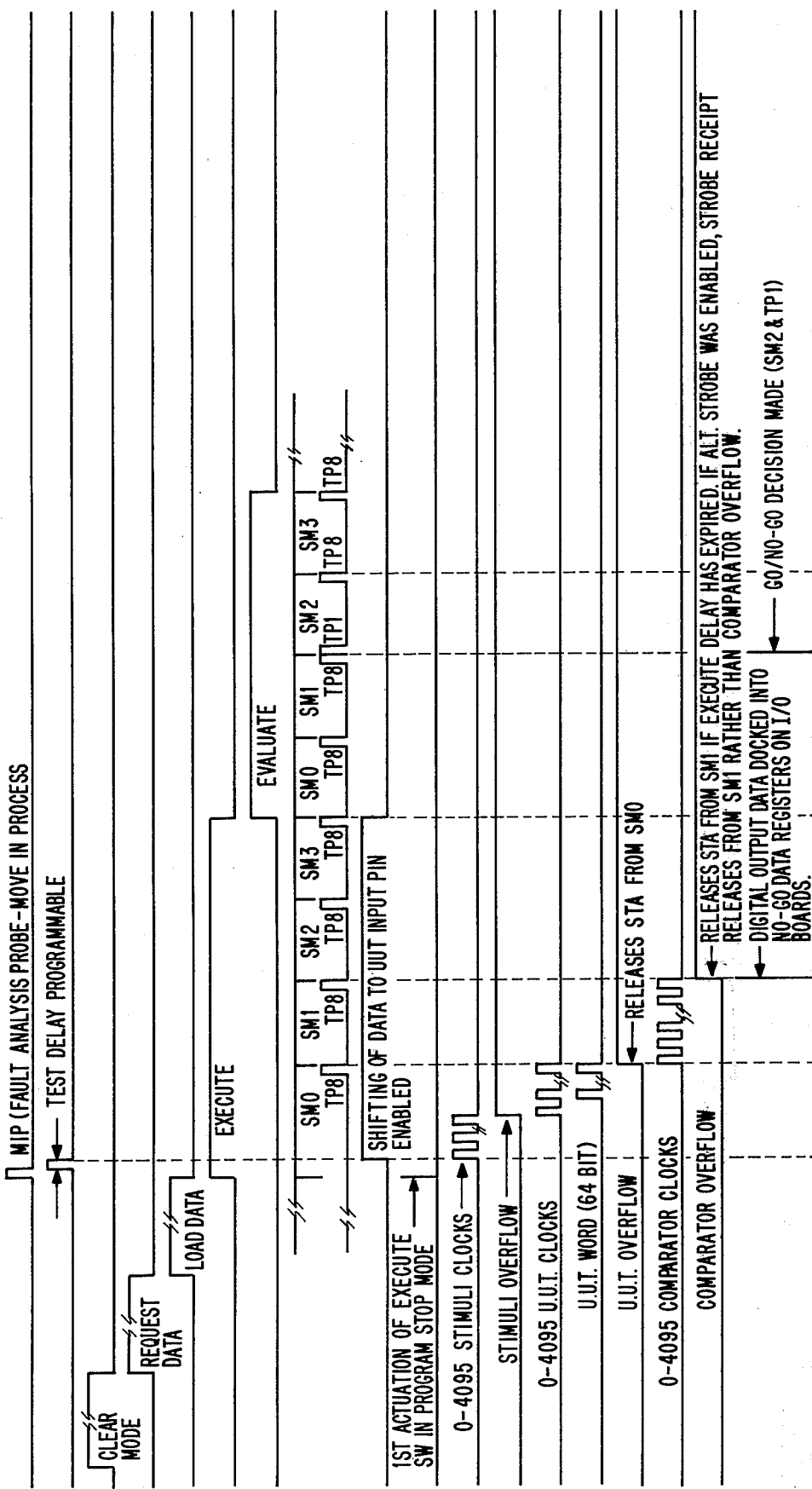
Fig. 17 (part 1 of 2).

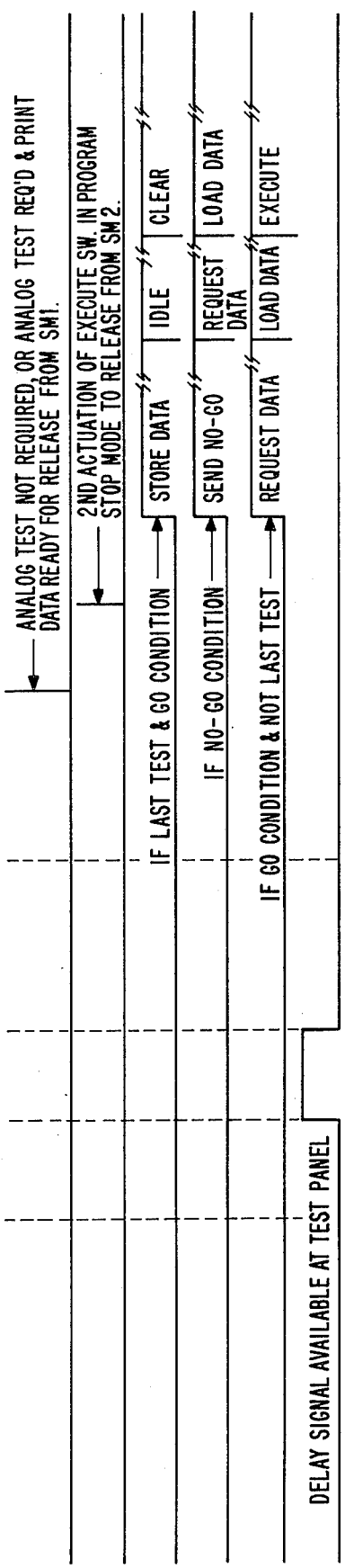
Fig. 17 (part 2 of 2).
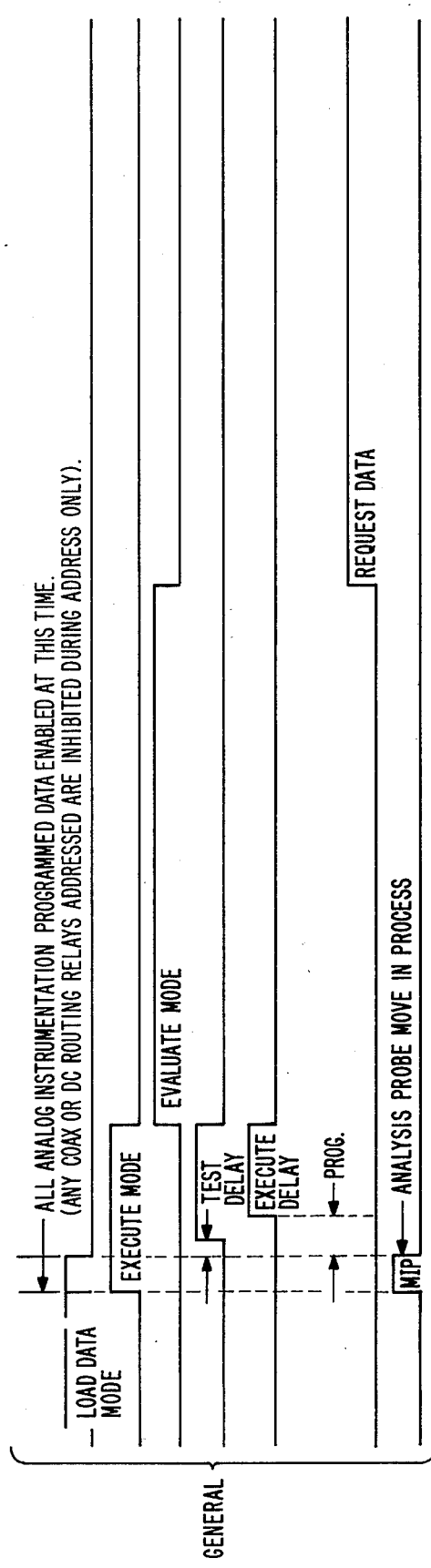
Fig. 18.

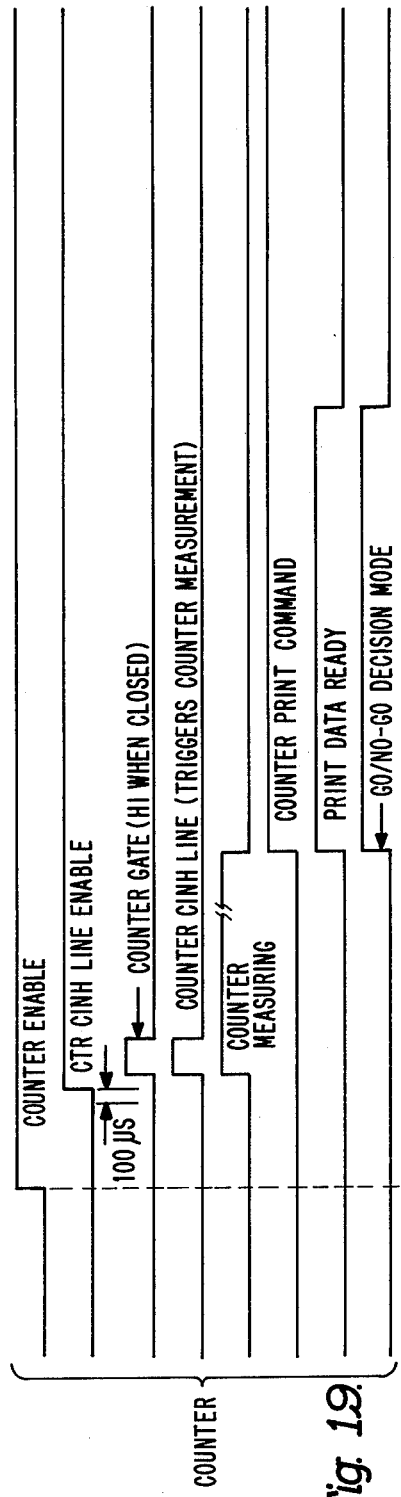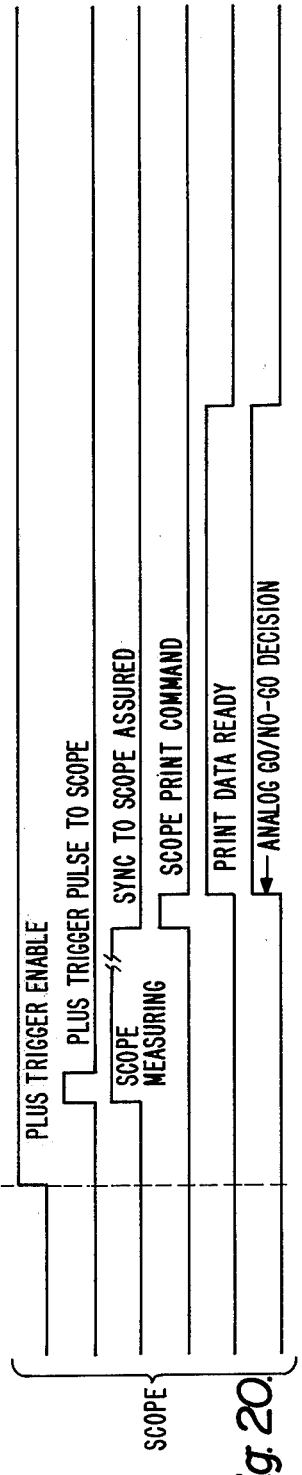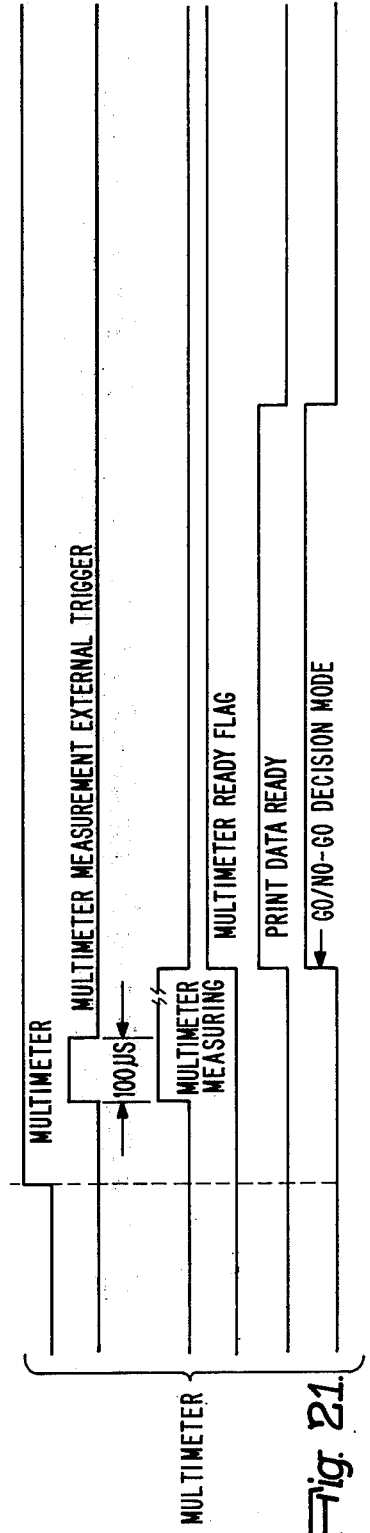

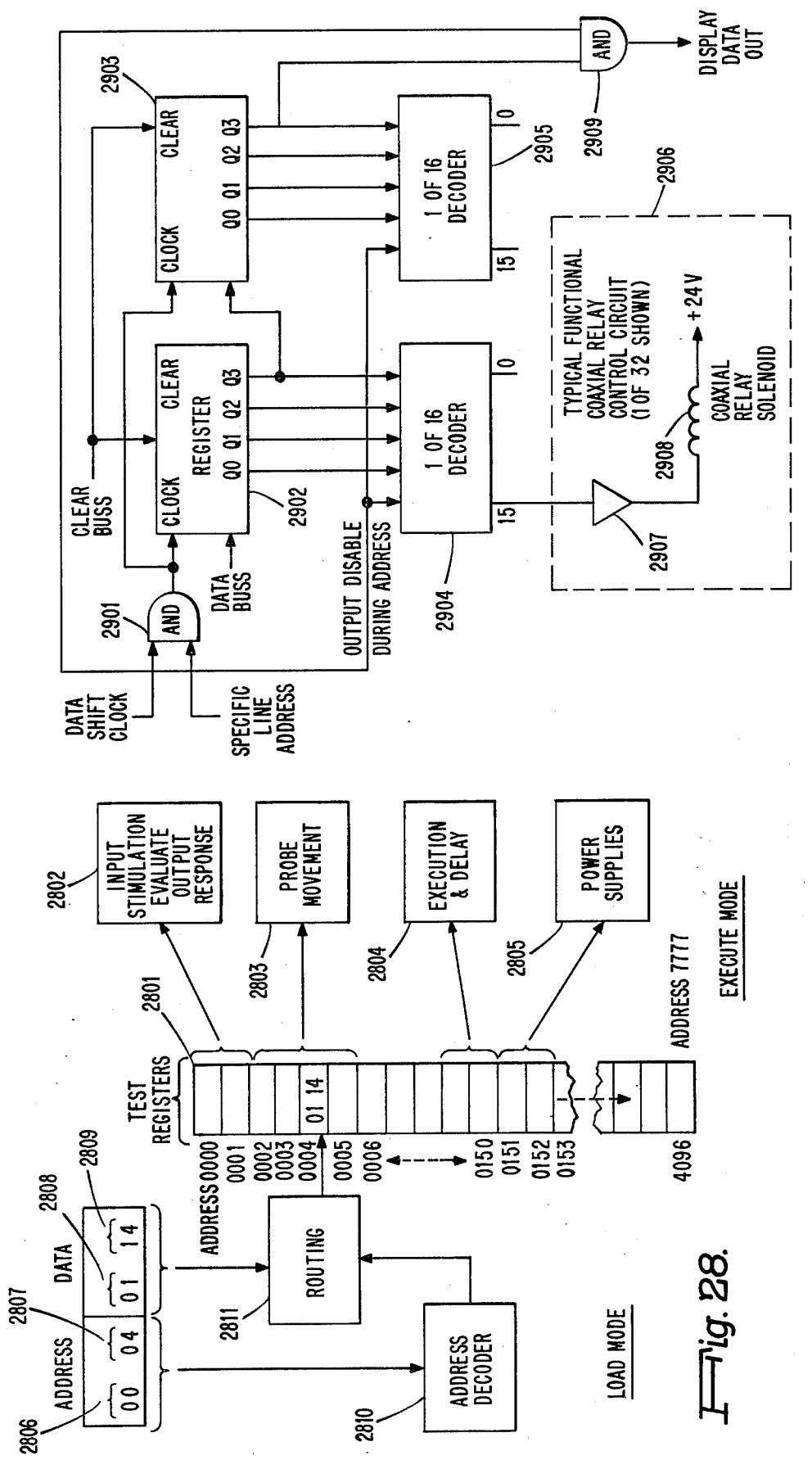

NON-LOGIC PRINTED WIRING BOARD TEST SYSTEM

BACKGROUND OF THE INVENTION

1. Field of the Invention

This invention relates to an automatic printed circuit board tester for testing and diagnosing faults in analog and digital networks and more particularly to an automated fault isolation system for use in trouble-shooting printed circuit boards.

2. Description of the Prior Art

The use of plug-in printed circuit boards in electronic packaging is well known. With the advent of integrated circuits, more complex electronic functions are packaged on a single printed circuit board thus increasing the packing density as well as the complexity of the circuit board. These trends have the potential for decreasing the cost per circuit for a manufacturer utilizing the circuits, since economy can result from the low cost of manufacturing the basic printed circuit board due to the use of automated equipment for plating, etching, drilling, automatic insertion of components in the printed circuit boards, etc. However, with the increase of complexity of the circuits the probability of failure becomes greater, the test and diagnosis of failures assumes a disproportionate part of the manufacturing costs. Accordingly, automated test systems have the potential for reducing test and trouble-shooting costs by speeding up the test and trouble-shooting activity by several orders of magnitude and reducing labor requirements. However, even though the testing activity may be speeded up tremendously so that the printed circuit boards may be classified into good and bad printed circuit boards there still remains the task of isolating where the fault lies in those branches that failed. This in itself is no trivial task. It can be appreciated that because of the complexity of the circuits which may number upwards of hundreds in one printed circuit board the probability of a fault occurrence in some one of these circuits on the printed circuit board is very great—in the order of 40% of all the circuit boards tested. To isolate and locate a fault by hand probably requires an average of twenty minutes per circuit board. Add to this the inordinate amount of labor, equipment and space to house this labor and equipment and one can appreciate the enormous cost of fault isolation by hand.

What is needed therefore is an automatic printed circuit board tester to test and diagnose faults in printed circuit board networks.

OBJECTS OF THE INVENTION

It is a primary object of the invention therefore to provide an improved automatic printed circuit board tester to test and diagnose faults in printed circuit board networks.

It is another object of the invention to provide an automated fault isolation system for locating faults in failed printed circuit boards.

It is a further object of the invention to provide an automated fault isolation system for printed circuit boards having a moving probe assembly controlled by a programmed computer.

Still a further object of the invention is to provide an automatic printed circuit board testing system to test and diagnose faults in both analog and digital networks.

Yet another object of the invention is to provide an automatic printed circuit board tester to test and diagnose faults in printed circuit board, digital and analog networks of different types and of different dimensions.

SUMMARY OF THE INVENTION

In accordance with the above and other objects of the invention, an automatic printed circuit board tester is provided to test and diagnose faults in printed circuit board digital and analog networks.

The automatic circuit board tester is comprised basically of system controlled, stimuli, measurement and interface networks.

System control provides the data, timing and control signals necessary to accomplish a test and collects the results at the completion. The stimuli section provides the various exitation signals to the system under test. The measurements section captures the test results, makes Go/No-Go evaluation, and converts data to a form suitable for collection. The interface section permutes the stimuli and measurement lines so that they are connected to appropriate points (usually fingers of printed circuit assembly) and provides conditioning as required.

A minicomputer provides primary system control for obtaining files, initializing, analyzing results, and capturing historical data. Intermedia control of the stimuli, measurement and timing functions, are centered in the test hardware to provide higher speed data transfer, upward expansion potential and to minimize the CPU dedication.

Initially, the system is in the Idle mode. The act of sliding a printed circuit assembly into the test connector causes a pressure switch to be activated. This switch closes the test finger contacts and issues a start command to the data source. The system control then advances to a Clear mode that clears all programmable registers in the system and advances the system into the Request Data mode. The Request Data mode signals a data source that the data for the next test is needed. The control system selects the data source on the basis of front panel control settings. The system advances into the Load Data mode. In this mode, data is transferred from the data source to the programmable data registers via a serial bus. When all data necessary to execute the test have been transferred to the programmable registers an Execute address signal is generated which is recognized by the system and initiates the Execute mode. During the Execute mode, the programmed stimuli are applied. The duration of the stimuli is selected by program control. As soon as this duration is completed, a strobe signal is issued. The strobe initiates the Evaluate mode. In the Evaluate mode, the station digitizes analog values captured at strobe time, compares them to limits, and proceeds via one of a plurality of paths to determine the test results. Possible paths are to (a) Unload Results (if a NO-GO has occurred), (b) Request Data (if a GO occurred and this was not the last test) or (c) to Store Data (if this was the last test). The Unload Results mode sends the NO-GO information to the minicomputer for fault isolation and statistical purposes. Store Data is also used for Statistical purposes.

Automated trouble-shooting of the digital printed circuit boards and the digital subsections of the analog boards are handled by the use of a moving probe assembly and by nodal reference files that contain the logic values for all digital nodes for each test. The moving probe assembly is automatically driven from the failed output pin to adjacent nodes in the network under program control utilizing interconnect files. The node values are compared with nodal reference values in the nodal reference file until the fault path terminates.

BRIEF DESCRIPTION OF THE DRAWINGS

FIG. 4 is a portion of a typical interconnect file of FIGS. 3A–3B for directing a moving probe assembly along a predetermined path.

FIG. 5 is a block diagram of the automatic test and fault isolation system.

FIG. 7 is a logic block diagram of the master timing generator.

FIG. 13 is a table of group and line assignments of a predetermined line of registers within a predetermined group of registers.

FIG. 15 is a block diagram of the analog measurement routing system.

FIG. 16 is a logic block diagram of the analog stimuli routing system.

FIG. 17 is a timing diagram for the standard digital test.

FIG. 18 is a general timing diagram.

FIG. 19 is a timing diagram for the counter.

FIG. 20 is a timing diagram for the oscilloscope.

FIG. 21 is a timing diagram for the multimeter.

FIG. 28 is a block diagram of the addressing and program control for the test station.

FIG. 29 is a logic block diagram of the program data routine of the test station.

DESCRIPTION OF A PREFERRED EMBODIMENT

General

Figure 1:
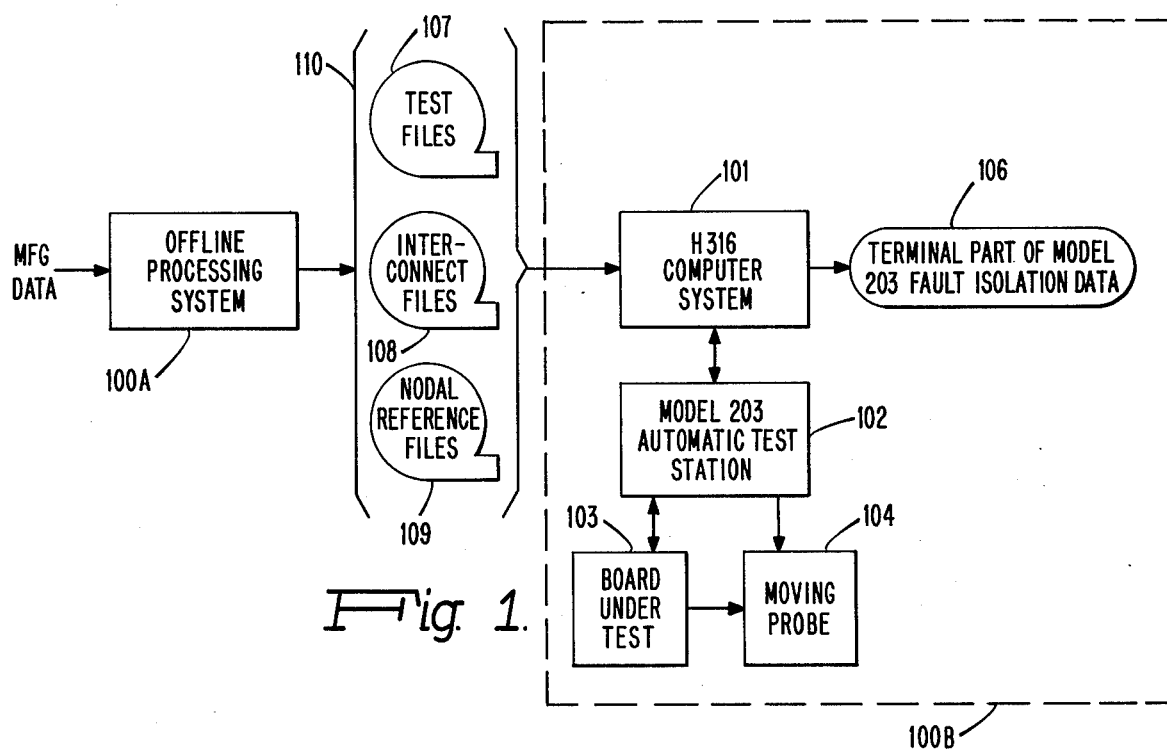
FIG. 1 is a block diagram of the automatic fault isolation system for printed circuit board assemblies.

The automatic printed circuit board test system FIG. 5 provides automatic testing and diagnosing of faults in digital and analog electrical circuit networks. The automatic testing and diagnosing is controlled by a test program. A typical test program consists of a sequence of test statements, each of which defines a discrete test step. A sequence of test statements are read into the test station 500 (See FIG. 5) in serial fashion from either a paper tape reader 507, from a Honeywell H316 computer 503, or from the station's internal memory 515. A test program is loaded into any or several groups of registers 508a, 502a and 505a (to be more fully described infra) which are diffused throughout the test station 500. The information in the station register control the station functions for each discrete test step. The station registers are divided into 16 groups numbered octal 0 to 17 and each group contains 64 lines of registers numbered octal 0 to 77.

The test program loaded into 1 or several groups of station registers comprise a series of statements, each statement defining a discrete test step. Each statement consists of 4 characters identified as Characters 1–4; taken as a whole these characters identify the group of registers, the line within each group, and two data words 1 and 2. The format of the statement in test machine language is as follows:

| Character Number | Description |
| --- | --- |
| 1 | Group Address |
| 2 | Line Address |
| 3 | Data Word One |
| 4 | Data Word Two |

Each character consists of 6 bits which hereinafter will sometimes be referred to as 2 octal digits of 3 bits each. The pair of data words, 1 and 2 are in actuality the test machine language characters 3 and 4 and are the characters or data words which are placed into the machine registers addressed by characters 1 and 2.

Information may also be entered into the station register via the thumb wheels 508a in control panel 508. Any data entered via these thumb wheel switches will replace data previously stored in a data register. These thumb wheel switches are used to temporarily modify and verify a program before the change is implemented on the paper tape or in the computer program.

As previously stated the station registers may also be loaded from an 18K word internal memory 515. This 18K word internal memory itself may also be loaded from either the paper tape reader 507 or the H316 computer 503. After a test program is in internal memory, the station reads the program from internal memory one statement at a time. This mode of operation provides speed in loading the registers far greater than is obtainable by loading the registers directly from either the paper tape reader 507 or the H316 computer.

A printed circuit board is the Unit Under Test (UUT) and is placed in a test head assembly 504. The test head assembly 504 is basically comprised of left and right adapter boards 550a and 550b (i.e., Input/Output Matrices) which connect the station test and stimuli lines to the UUT via interchangeable pin blocks 550c and 550d. The adapter boards are wired for a specific style of printed circuit board (i.e., UUT) and may frequently contain electronic components needed for the test sequence. They are changed for testing different styles of circuit boards. The interchangeable pin blocks have different spaces between adjacent pins to permit the test station to accommodate many different styles of printed circuit boards.

There are 280 station lines, 128 lines per side of the test head assembly 504 connected to standard digital input/output unit 526, and 12 lines per side of the test station connected to special digital stimuli unit 524. There are also 24 stimuli lines, 12 stimuli lines per side of test head assembly 504 connected to analog input and output unit 527; and there are 24 special comparator lines, 12 per side connected to special digital comparator unit 525. Additionally, there are 24 DC routing lines, 12 per side of the test head assembly connected to bus routing unit 530 having nodes E, F and G. Moreover, 24 station analog measurement lines, 12 per side of the test head assembly 504, are also coupled into analog input and output unit 527.

The 280 station lines (256 coupled to standard digital input/output unit 526 and 24 coupled to special digital stimuli unit 524) are numbered 000 to 279 and are selected before each discrete test step to perform a special function by the machine test language statement. For example, group address 04, line address 02, data word one 01 and data word two 00, will cause line 011 to be examined for a "1." These lines may be used to apply either a stimulus and/or to measure a signal from the UUT. Any of the 256 standard digital lines available to the UUT may also be used as output lines. These lines will accept voltage levels from 0 to plus 5 volts. The 24 special comparator lines operate in a manner similar to the standard digital lines except that they may accept a voltage level from −5 volts to +5 volts. When a digital failure occurs during a discrete test step, one or more of 280 No/Go indicators will be lit on the display panel 510. These lights correspond to the 280 possible digital output lines (i.e., 256 standard plus 24 special); in addition the digital and/or analog No/Go lights will illuminate to indicate a digital or analog failure.

A UUT stimulus falls into 1 of 2 catorgories — analog or digital. Either or both may be used in a discrete test step. An analog stimulus is obtained from 1 or both pulse generators 545, 546 and/or a waveform generator 544. Any one of the 24 analog station lines may be used to route the stimuli UUT through the board adapters on the test head. The 24 analog lines are divided into 2 sets of 12 each referred to as nodes C and D. The lines may be used interchangeably. During a discrete test step, a single line from either node or both may carry a stimulus.

A digital stimulus may be in 1 of 4 forms, (a) a standard digital input, (b) a special digital input, (c) a digital clock input, or (d) a word input. On a discrete test step, if a digital stimulus is applied, it may be either a single bit (i.e., 1 or 0), a series of bits of 1's and 0's or one or more very short duration pulses. The specific stimulus will be determined by the test program.

A standard digital input is a TTL compatible signal, or signals, which may be applied to any one of the 256 standard digital lines on the test head. A stimulant may be a single 0 or 1 or it may be a sequence of 0's and 1's. The sequence is an 8-bit pattern specified in the test program. The 8-bit pattern may be programmed to repeat several times so that the sequence may contain up to 4,095 bits. The rate and number of bits is determined by the stimuli clock. The 24 special digital input lines are similar to the standard digital lines except that the standard digital lines are TTL compatible while the special input lines may be programmed to have 1 and 0 levels within the range of −36 volts to +36 volts.

The UUT clock input from UUT Clock and Word Unit 523 is applied to either side of the test head and is 1 or more very short pulses (i.e., 50 nanoseconds). Once again the number of pulses in the rate is determined by the test program. The UUT word input is also applied to either side of the test head and provides a sequence of 1 and 0 bits with TTL compatible signal levels. The bit pattern may be as long as 64 bits and this pattern may be repeated to provide a sequence up to 4,095 bits. The rate at which the sequence of 1's and 0's is applied to the unit under test and the number of bits in the sequence will depend upon the UUT clock input. Digital timing is normally controlled by two clocks called the stimuli clock, which controls timing and stimuli and the comparator clock which controls the timing of measurements. The stimuli clock is programmed to provide 1 and 0 levels to 1 or more of 280 digital lines. The rate at which tests applied and the length of the sequence of 1's and 0's is specified by the test program. The comparator clock on the other hand provides a square wave which is used to control measurement timing. The time of a period and the number of periods, called the number of clocks, are specified in the test program. The delay time is the number of comparator clocks (i.e., number of periods) multiplied by the time of the signal period. This delay time is the time from the last stimulus input applied to an UUT until a station strobes the output from the UUT.

Measurements on an UUT are also either analog or digital. An analog measurement is made with either the oscilloscope 541, the timer counter 543, or the multimeter 542. These devices are connected to the Unit Under Test and measurements made under program control. During a discrete test step, one of 3 lights $\alpha$, $\beta$, $\gamma$ on the display panel 510 representing the counter, multimeter or scope respectively will indicate the device selected for an analog measurement. The upper and lower limits for the analog measurement in the test program is displayed along with a measured data on the display panel 510. These devices are also used to assist the operator in adjusting a component on a Unit Under Test. The device used will have been programmed to automatically make a continuous measurement of a station line connected to the UUT. When the test sequence is stopped, the operator observes a continuous measurement reading on one of the three devices by depressing an inhibit disable switch (not shown) twice.

There are 24 station lines which are used for analog measurements. These are divided into 2 node sets of 12 each. The sets are referred to as sets (nodes) A and B. The lines may be used interchangeably. During a discrete test step, a single line from either set or both may be used for an analog measurement.

The 24 DC signal routing lines may be used in a test sequence for a variety of purposes. For example, they may connect a power supply to the unit under test; or may connect a multimeter to the unit under test. These lines are connected to 1 of 3 buses called nodes E, F, G in bus routing unit 530. The power supplies on the test station refer to either the programmable supplies 548 that provide inputs to a unit under test or to a fixed power supply 547 that provides power to the test station itself.

The test head assembly 504 also has a movable fault analysis probe which is controlled by three commercially available stepping motors, one for each of the X, Y and Z directions respectively. Each motor is capable of traveling up to 65,535 steps under program control. The X and Y movements are accelerated at the start, and decelerated before completion in order to prevent positional errors which are typically less than 0.005 inches. Maximum speed in these directions are 1.8 inches per second. The motor used to position the probe in the Z direction (i.e., in and out from the board under test) is driven at a constant speed of 4.2 inches per second. The commercially available fault analysis probe FAP is utilized to perform measurements of signals in the 40 millivolt to 40 volt range and has a frequency response from DC to 35 MHz. The probe is also used for analog measurements of digital high speed diagnostics when operated in conjunction with the computer 503.

Examining a hypothetical board which requires 200 Execute commands by this test system with each Execute command causes an average of twenty tests to occur. It is noted that four thousand tests are performed. The sequence of this hypothetical board test consists of picking up a board and inserting it in the station, generally requiring one second for a trained operator, an initialization routine which requires about 50 milliseconds for power up, settling time, etc. and 200 Execute cycles. Thus, in a very short period of time, the system determines whether a circuit board is acceptable for shipment or for use.

Those circuit boards that have failed for tests are further tested to isolate the portion of the circuit that has failed in order to correct the fault. The fault isolation system of the automatic printed circuit board tester comprises generally an off-line processing system, an on-line processing system, a moving probe assembly, and standard measuring instruments.

Figure 2:
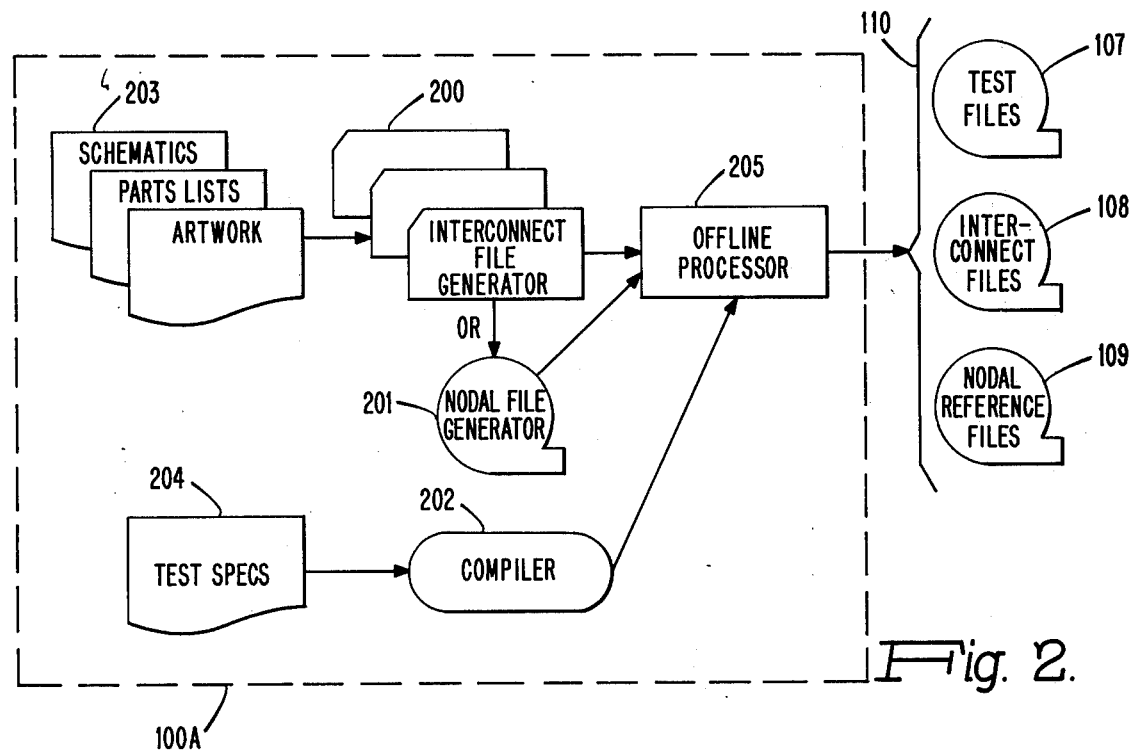
FIG. 2 is a block diagram of the off-line processing portion of the automatic fault isolation system.

Referring to FIGS. 1 and 2, the off-line processing system denoted 100A is used to convert raw manufacturing information to forms useful in the test system. FIG. 2 illustrates in greater detail the off-line system 100A. The compiler 202 aids in converting analog printed circuit board test specifications 204 to automatic test station machine language. The output of the compiler is a test file 107.

The interconnect file generator 200 converts schematic information and coordinates for test points 203 to a formatted file 108.

The nodal file generator 201 uses the interconnect file output of interconnect file generator 200 to determine a reduced directed graph 3C (discussed infra) then obtains the nodal reference information and formats the nodal reference file 109.

The on-line processing system 100B uses the interconnect file 108, the nodal reference file 109, and the test system 500 to determine a fault path, and isolate possible failures. It does this by driving the moving probe assembly 104 (See also FIG. 27) from the failed output of the board under test 103 back into the network and comparing the measured value at each node of the network with values in the nodal reference file 109. When the fault path terminates, the interconnect file is further used to identify possible failed components. The moving probe assembly 104 is comprised generally of an X-Y table and a high impedance probe with approximately 35 MHz bandwidth commercially available from Hewlett-Packard and other companies. The table is capable of positioning the probe within 5 mills of a predetermined programmed value.

Figure 3A:
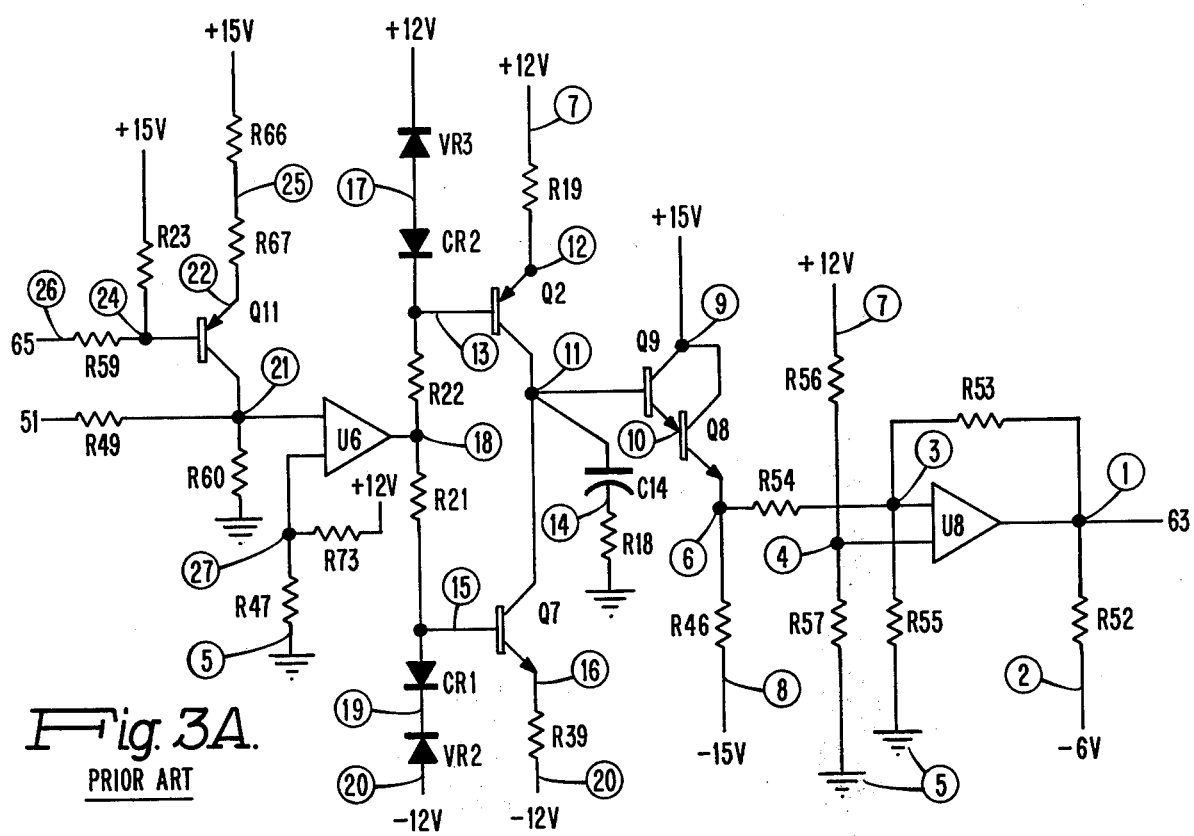
FIG. 3A is a schematic prior art diagram of a typical printed circuit board for illustrating the fault isolation technique.
Figure 3B:
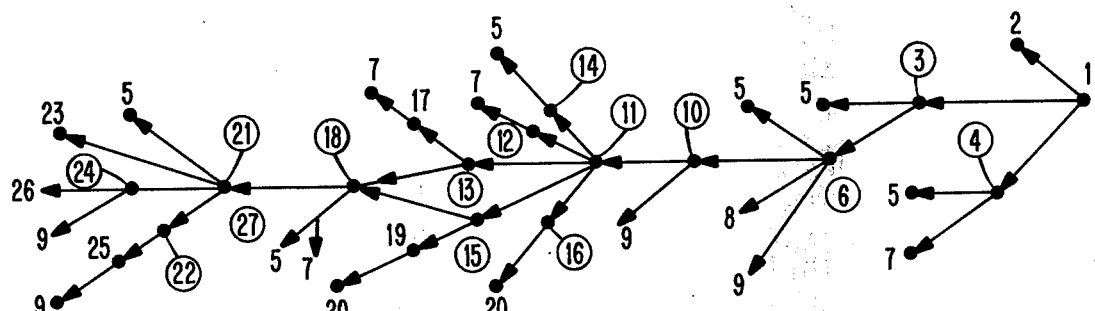
FIG. 3B is a directed graph network of the electric network of FIG. 3A.

An examination of the features of the automatic fault isolation system is facilitated by considering a typical network under test (FIG. 3A) as a directed graph (FIG. 3B). The nodes in the directed path FIG. 3B correspond to the nodes in the typical board under test FIG. 3A and are denoted by numerals encompassed by circles on FIG. 3A. The branches of the directed graph correspond to elements or sets of elements of a typical circuit board. The fault isolation system establishes a fault path from an output pin to a terminal point within the network. The location of the terminal point together with the directed graph is then utilized to select branches that could cause the failure. The nodes on the fault path are called "fault nodes" and the last node in the fault path the "failed node." Associated with each failed node, a "failed branch" is defined leading out of the failed node. The failed branch is then the component or components causing the failed node. The fault resolution capability of the system is thus determined by the number of branches leading into the failed node and the number of components represented by these branches. When a signal passes through a failed branch, it undergoes distortion to an out of tolerance condition which can be detected by the instrumentation.

As previously noted, the fault isolation system requires two types of description files for fault isolation. They are:

1. an interconnect file, and
2. a nodal reference file.

A portion of a typical interconnect file for the printed circuit board of FIG. 3 is shown on FIG. 4. Note by referring to FIG. 4 that the physical location of the nodes are identified relative to the element or elements of a path or branch. Moreover, the parts are identified such as resistor R52, etc. and the schematic connections of parts are also identified in relation to their physical presence between nodes. The interconnect file contains also the information required to construct the directed graph and to physically locate any point. The nodal reference file (not shown) contains the value that should be measured at the point under test and may be predetermined by calculations or empirically. When a fault path terminates, the components in the branches leading from the failed node are found from the interconnect file. Referring to FIG. 4, a level is indicated. The levels listed in FIG. 4 refer to the distance (minimum number of branches) that must be traversed to reach the node.

Figure 3C:
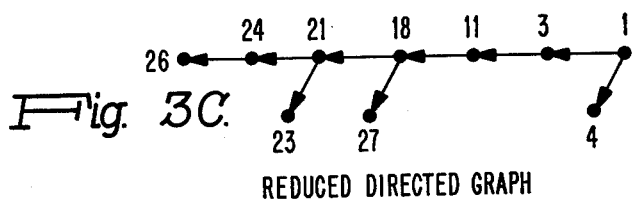
FIG. 3C is a reduced directed graph of the network of FIG. 3B.

The graphic representation of FIG. 3 is represented in the form of a file in FIG. 4. The X's encompassed by circles are points selected for illustration as test points for this particular test of this particular board. They are either inputs to unilateral elements on the printed circuit board or printed circuit board pins. They have been selected by identifying the unilateral elements from the parts list and then condensing redundant paths and loops into single nodes. The interconnect file of FIG. 4 provides information for formulating the directed graph network of FIG. 3B and the reduced directed graph of FIG. 3C.

To illustrate how the system works, assume hypothetically that resistor R73 FIGS. 3 and 4 has failed — i.e. failed branch from node 27 to node 7 (see FIGS. 3A–3C). The test at pin 63 of FIG. 3 reveals a failed output, and the system drives the moving probe to test points 3 and 4 i.e. level 2. This reveals that 3 is a fault node. Repeated use of the probe reveals a fault path from 3 to 11 to 18 to 27, with 27 being the failed node. An examination of the branches entering the failed node implicates either the resistor R47 of resistor R73 as failed components.

DETAILED DESCRIPTION OF THE INVENTION

Referring now to FIG. 5, there is shown a block diagram of the general purpose circuit board testing and fault isolation system. The principle elements of the system comprise a test station 500 and a commercially available computer 503 such as the Honeywell Series 316 minicomputer commerically available from Honeywell Information Systems Inc. Transfers of data and control signals are effected via control electronic assembly 501 and interface assembly 502. (Although separate blocks are utilized in FIG. 5 for grouping of the various assemblies, it is to be understood that this is for ease of explanation only and the physical groupings within the test control station may be either centrally located or close to the element being controlled. Accordingly, data transfer control network 513 is shown in all of blocks 501, 502 and 505. Similarly, station display and control 519 is shown in separate blocks 501, 502 and 505. Other elements may be similarly included). Data transfer networks are well known in the computer art and any suitable type may be utilized for this invention. A typical data and control signal transfer network is described in detail in U.S. Pat. No. 3,715,727 entitled "A Data Pooler System," and issued on Feb. 6, 1973.

Timing

Figure 8:
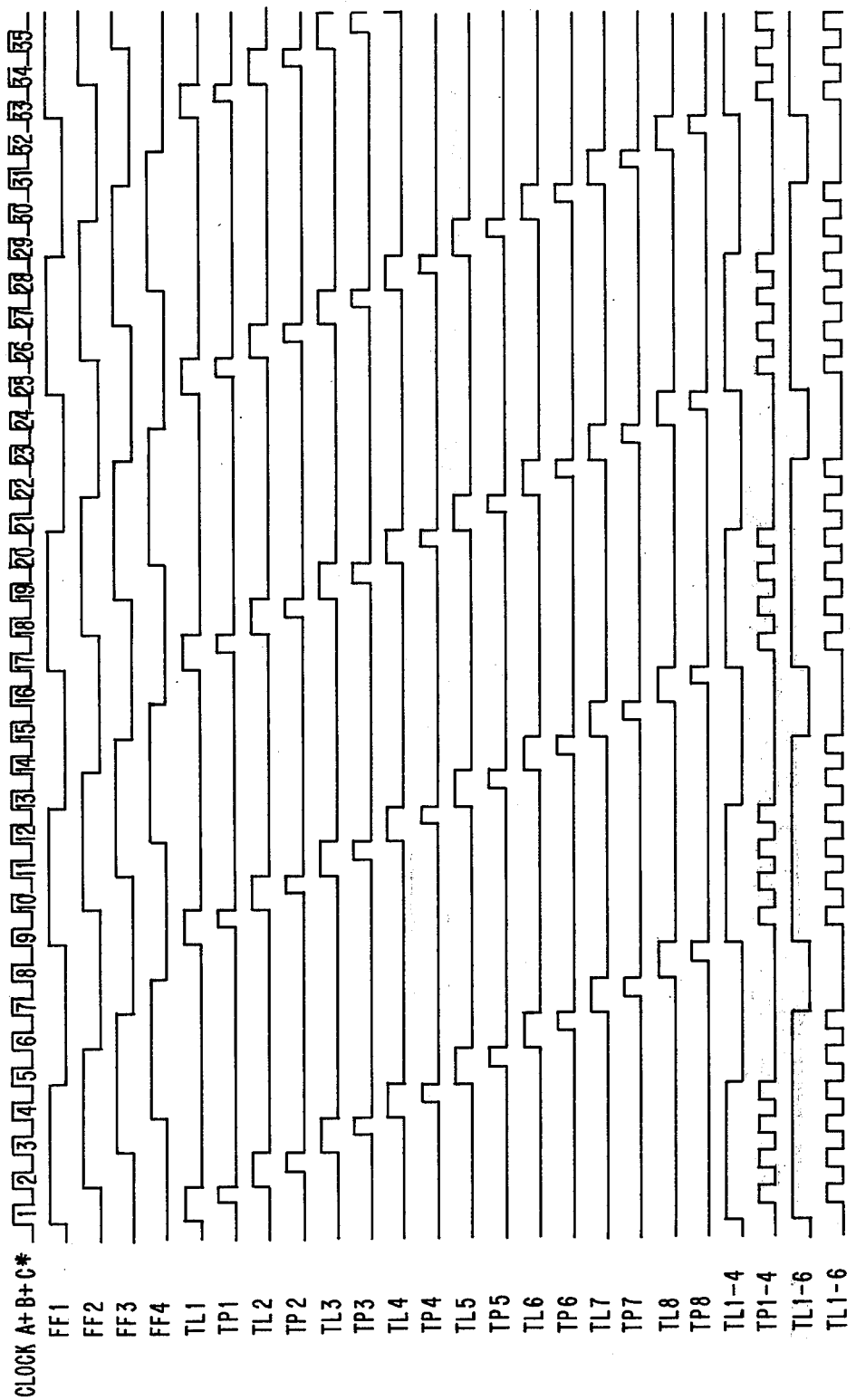
FIG. 8 is a timing diagram showing the timing pulses produced by the master timing generator.

Master timing control 514 is shown on FIGS. 7 and 8 and is basically comprised of a Johnson counter, internal crystal oscillator, and gating to provide a sequential set of 16 discrete timing steps per complete cycle. Referring to FIGS. 7 and 8 there are basically three clocks — clocks A, B, and C — for generating the discrete timing steps.

Clock A also referred to as the internal clock is a 36 kilohertz signal apparatus, used under any of the following conditions: (a) clear, idle or evaluate mode (b) load data mode when stop latch and either manual or display latch are set (c) request data, store data or send No-Go when destination ready signal is present, i.e., signal from computer in on-line operation indicating computer is ready to receive signal. In off-line operation, this signal would aways be high.

Clock B also referred to as external clock, is a clock provided by interface electronics to provide clock signals to the computer, or tape reader data into station registers. This clock is used as a source for master timing counter when unload data mode and stop latch is not set.

Clock C also referred to as a stimuli clock is basically a programmed version of a station or time interval counter crystal oscillator. The stimuli clock is used as a source for master timing counter any time station is in execute mode. This is the mode in which stimuli are transferred to the unit under test.

Two steps occur for each clock period of counter clock. One step having prefix TL covers a complete period of one counter clock; another step having prefix TP covers the last half of period for one counter clock. The identification of steps in the order of occurrence in the cycle is as follows: (1) TL-1, (2) TP-1, (3) TL-2, (4) TP-2, (5) TL-3, (6) TP-3, (7) TL-4, (8) TP-4, (9) TL-5, (10) TP-5, (11) TL-6, (12) TP-6, (13) TL-7, (14) TP-7, (15) TL-8, (16) TP-8.

Two discrete times per clock period are provided for gating two successive sequential events such as enabling parallel dump and clocking. For example, a common practice is to enable a counter for parallel dump with TL-8 and clock transfer of parallel data with TP-8.

Gating signals such FF1 through FF4, which are outputs from the discrete stages of the master timing counter 701, TL 1–4 which are true signals during TP-1 through TP-4 and TL 1–6 which are true signals during TP-1 through TP-6 times are used in various circuits in the station to provide the correct timing.

Master Mode Control

Figure 9:
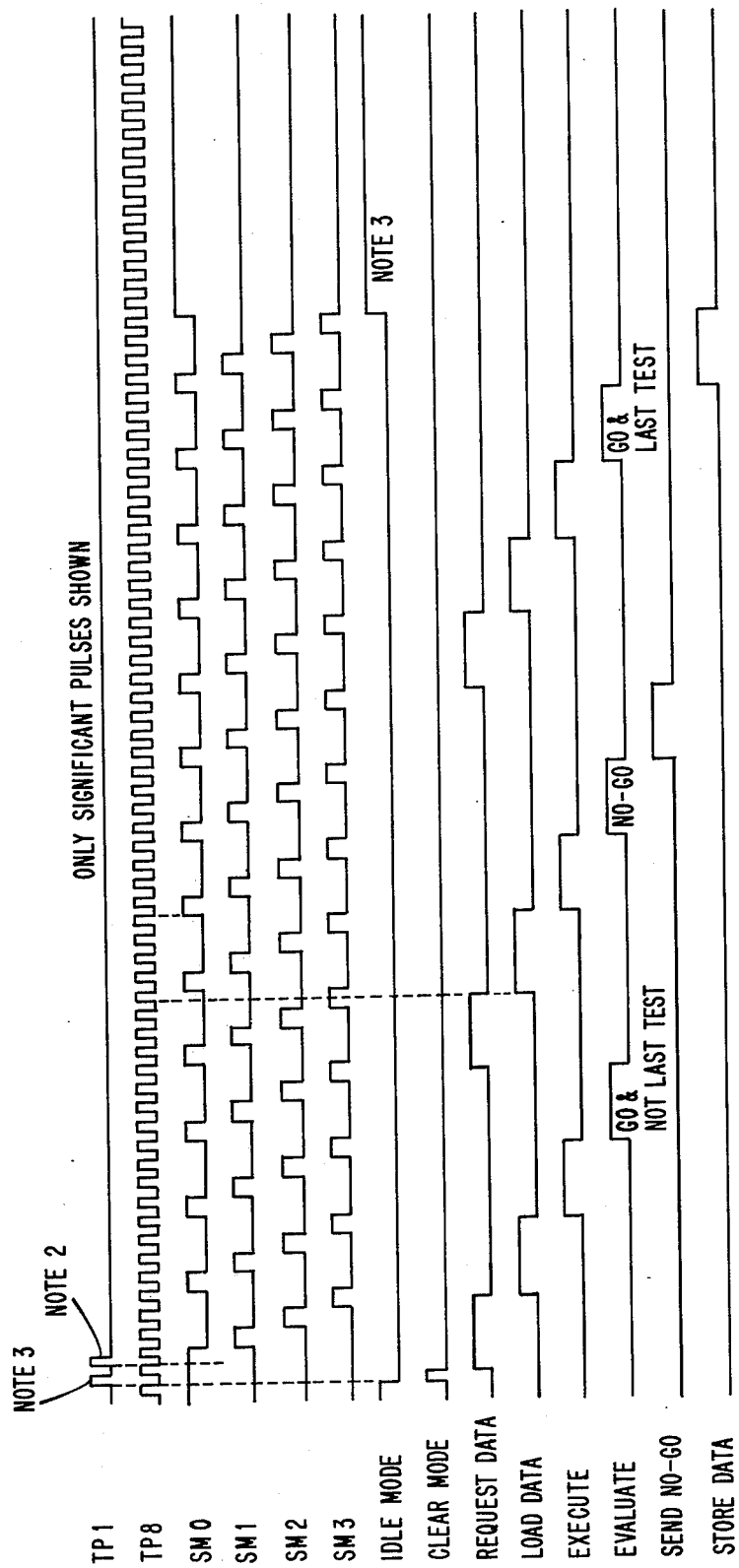
FIG. 9 is a timing diagram for mode and submode timing.
Figure 12:
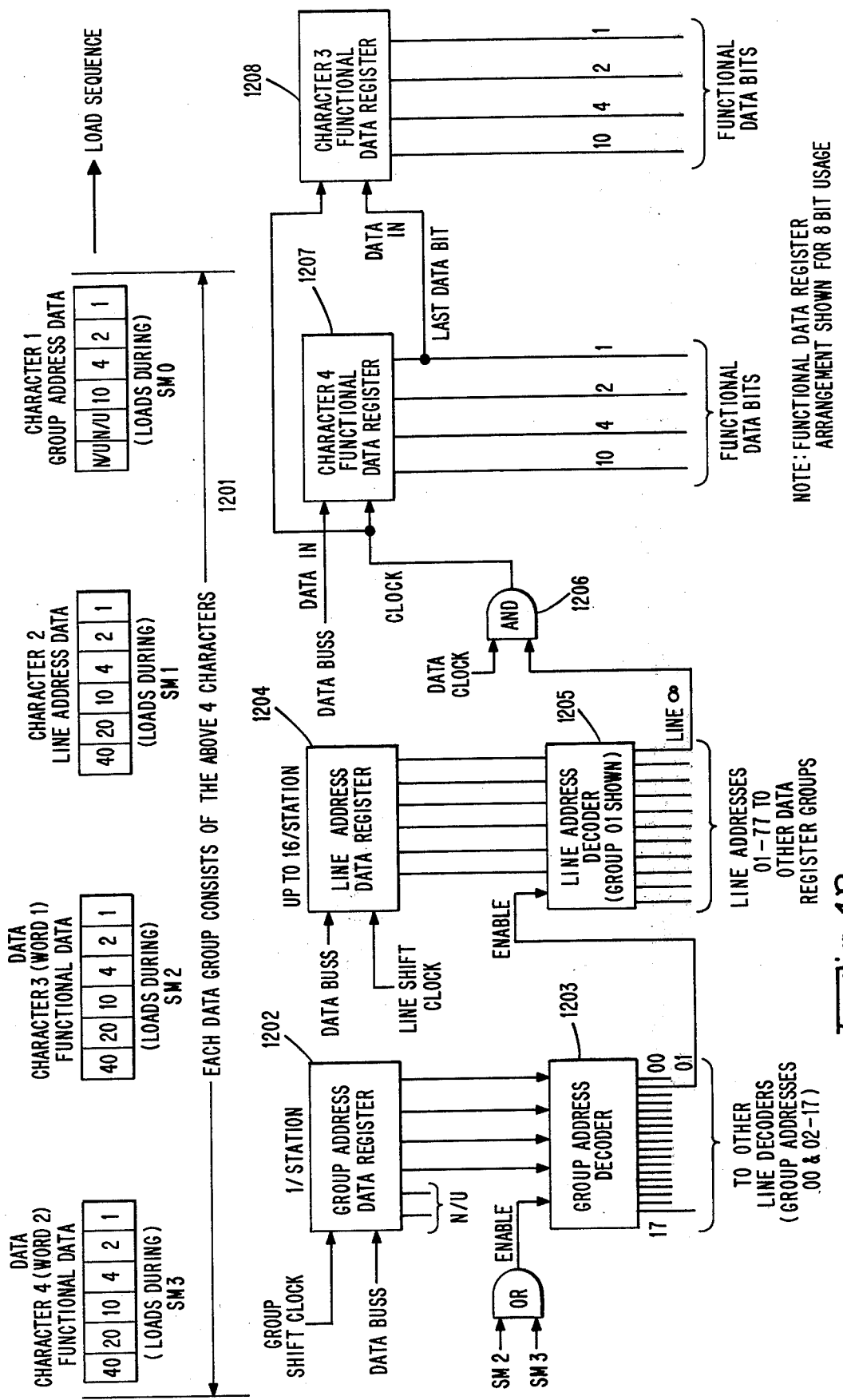
FIG. 12 is a block diagram of the addressing system of the test station.
Figure 14:
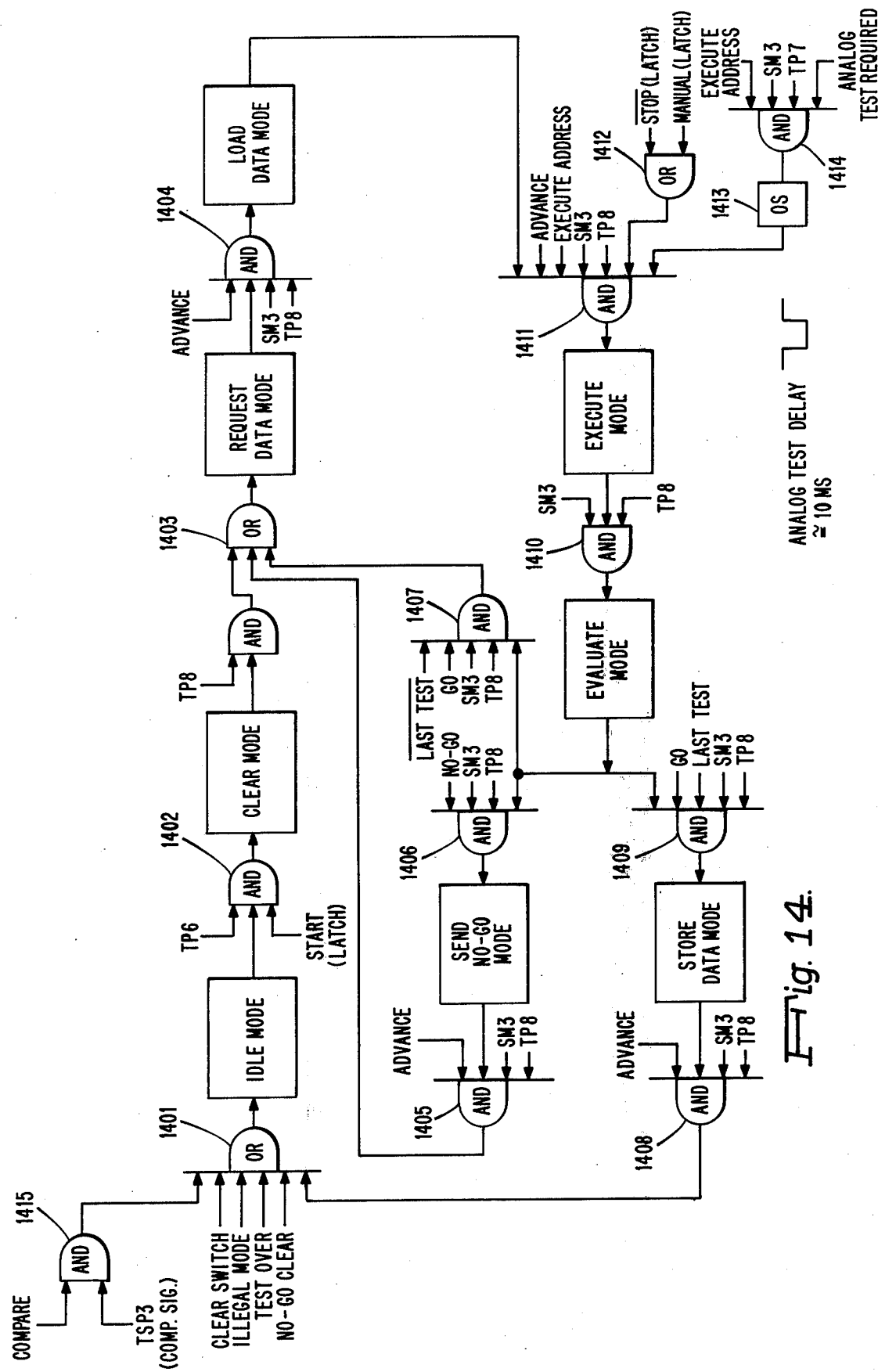
FIG. 14 is a logic block diagram of the mode control system of the test station.

Master mode control (see FIG. 14) provides a selected sequence of cycling through eight discrete modes i.e., steps. These eight modes provide gating which establish sequence and timing of basic station functions. Referring to FIGS. 9 and 14, entry and departure from each mode and the function of each mode is described.

a. Idle — This is the mode in which the station waits following initial power application. During follow-on operation, this mode may also be entered due to various clear signals directly from stored data mode. Referring to FIG. 14, the idle mode is entered when any of the following signals are present; clear switch, illegal mode, test over and no-go clear. Idle mode may also be entered when both compare and a TP-8 signal are present on AND network 1415 and OR network 1401. Departure from this mode to clear mode is normally accomplished via AND network 1402 when a TP-1 signal is present in conjunction with a start-latch signal. The start-latch signal is activated upon the occurrence of any of the following events: (1) the unit under test (UUT) is inserted in the test head, (2) when the test-initiate switch (not shown) is depressed, or (3) when the test unit 500 is placed under manual operation by depressing the input switch (not shown).

b. Clear — This is a transient mode, in which a clear signal is generated to clear the data bus. The time frame when the clear signal is presented to clear the bus is TP-6 and clears all functional registers 1207, 1208 (see FIGS. 7, 8 and 12).

c. Request Data — The test station may enter the request data mode from either clear mode or from evaluate mode via OR network 1403 or via AND network 1407. Entry into request data mode from clear mode is at TP-8 time; whereas entry from the evaluate mode is made when the previous test was a GO test and the previous test was not a last-test during submode 3, SM-3, and at TP-8 time. The request data mode is the mode in which the test station notifies the computer of a test station status and requests data. The test station awaits in this mode pending acknowledgement of receipt of data from the computer. In off-line operation this is a transient mode only.

d. Load Data — entry into the load data mode is always in the request data mode and the progression is to the execute mode. It is entered when an advance command signal, and SM-3 signal and a TP-8 signal are all present on AND network 1404. This is the node in which the test station receives data from either a computer in on-line operation, or from a tape reader 507, or internal memory 515 in off-line automatic operation, or from data wheels 508a in control panel 508 when the test station is in manual operation. Departure from the load data mode is dependent upon several conditions as follows: the presence of an advance command from the computer 503, if the test station is on-line operation, thus signifying all data for this test has been transmitted; the presence of an execute address command (group 04, line 77), signifying that the station is to execute the test; the station is not in stop (i.e., the stop latch is not set), or if the station is in stop, it must be set up for manual operation; the test station is not in sub-mode cycle 3 SM-3; and station has a leading edge of a TP-8 pulse signal.

e. Execute — During execute mode, the test is actually formed. Stimulation of inputs and strobing of outputs are initiated in this mode. Entry into this mode is always from the load data mode as previously discussed. Exit from the execute mode is via AND network 1410 during sub-mode-3 cycle (SM-3) during the presence of the leading edge of pulse TP-8.

f. Evaluate — During this mode, the results of the tests which were previously performed under execute mode are evaluated to determine the next course of action. Entry to evaluate mode is from execute mode only as previously discussed. From evaluate mode, the test station may exit to request data mode or to send No-Go mode or to store data mode. If the current test results are No-Go, exit is to the send No-Go mode via AND network 1406 during sub-mode-3 (SM-3) and pulse TP-8. If, on the other hand, current test results are Go and this happens to be the last test for that particular Unit Under Test (UUT), then exit is to STORE DATA MODE during SM-3 and TP-8 pulse signal. If, on the other hand, the test results are Go, this is not the last test, then exit is to the request data mode direct bypassing idle and clear mode.

Sub-Mode Control

Figure 10:
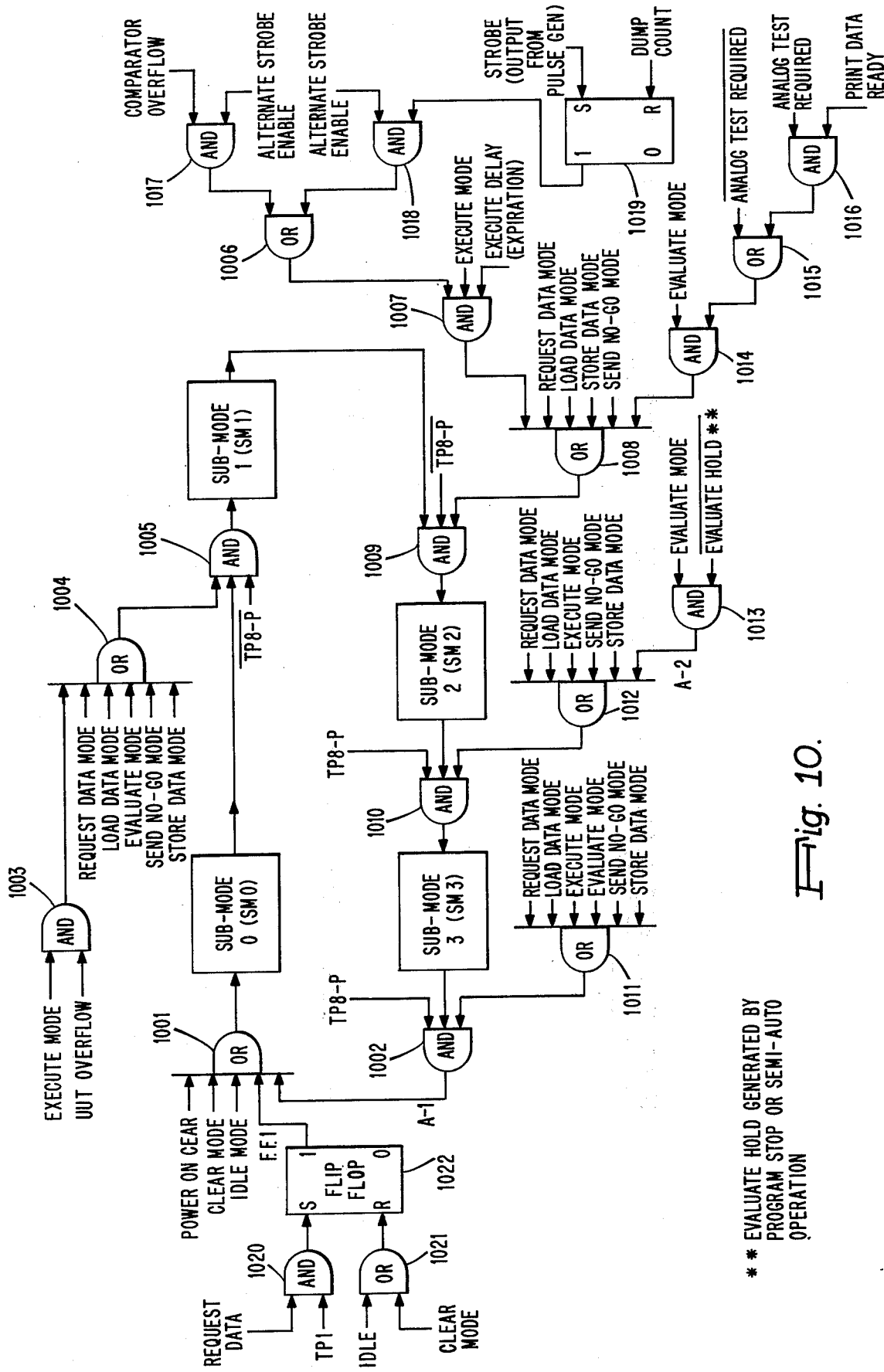
FIG. 10 is a logic block diagram for the submode control system.
Figure 11:
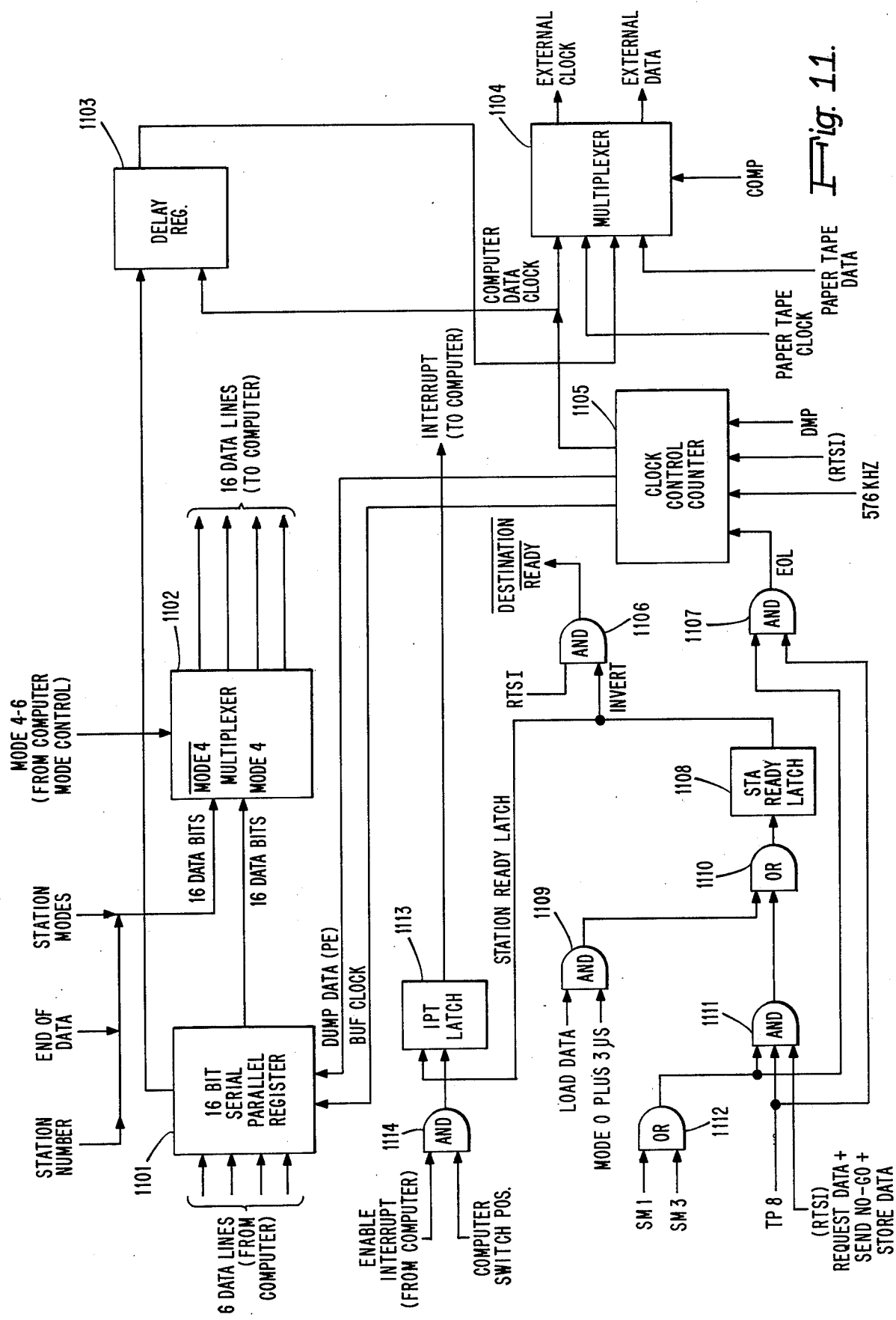
FIG. 11 is a logic block diagram of the computer interface data storage buffer system.

In addition to the master timing signals and the 8 modes of FIG. 14, there are four submode control signals shown in timing diagram on FIG. 9. The sub-mode control signal generator comprises basically a Johnson counter with serial clocking, parallel transfer and gating to provide sequential cycling through four discrete submodes. See FIG. 10. Referring to FIGS. 9 and 10, submode control signals SM0 through SM3 are generated. The figures are self-explanatory in that all elements for signal generation, signal names and modes have been labeled and arrows indicate the flow. As with the description given previously in conjunction with FIG. 6, the arrows indicate applied signals whereas the hardware is identified on FIG. 10. Accordingly, a person of ordinary skill in the art can construct all the Boolean expressions necessary to obtain the various submode signals. For example, referring to FIG. 10 and OR gate 1001, there are the following signals applied to it: power on, clear-mode, idle-mode, FF1 and A-1. Utilizing Boolean expressions, this would be written: power on + clear-mode + idle-mode + FF1 + (A−1) = submode 0. The Boolean expression derived from the signals applied to AND gate 113 would be: evaluate mode . evaluate hold = (A−2), which reads: evaluate mode and not evaluate hold equal = A minus two signal.

The four sub-modes provide gating signals which establish activities which are completed in each sub-mode or step. Depending upon the present mode and such things as amount of data to be transferred, one or more complete sub-mode cycles may be completed within a mode. One complete sub-mode cycle is required for transferring a data group (group, line, and two data characters).

Referring to FIG. 10 entry into sub-mode 0 (SM-0) is from power on, clear mode or idle mode direct via OR network 1001. Submode 0 may also be entered indirectly from request data, send no-go, load data, execute, evaluate and store data mode via OR gate 1001, in conjunction with sub-mode 3 and the trailing edge of TP-8 on AND gate 1002. Departure from SM-0 is dependent upon the first trailing edge of TP-8 on AND gate 1005 after attaining the following condition via OR network 1004: (1) either request data, load data, store data, send no-go, or evaluate mode; (2) execute mode in conjunction with UUT overflow signal on AND network 1003.

Entry into sub-mode 1 (SM-1) is always from SM-0 as previously noted. Departure from sub-mode 1 is dependent on the trailing edge of TP-8 on AND gate 1009 in conjunction with one of the following conditions: (1) request data, load data, store data or send no-go mode; or (2) execute mode in conjunction with execute delay expiration on AND gate 1007, which indicates that all comparator clocks programmed have been transferred and digital comparator strobe is complete or (3) evaluate mode in conjunction with OR gate 1015. One of the basic functions of SM1 is to provide enabling time for clocking of data into line address register.

Entry into sub-mode 2 (SM-2) is always from SM1. Departure from this sub-mode is dependent on the trailing edge of TP-8 on AND gate 1010 in conjunction with one of the following conditions: (1) request data, load data, store data, send no-go, or execute mode on OR gate 1012; or (2) evaluate mode on AND network 1013 in conjunction with second actuation of execute switch if a program stop was programmed or station was operated in a semi-auto operational mode. One of the basic functions of sub-mode 2 is to set enable time for clocking of character 3 data into the least significant bit positions or functional data registers. Also, go-no/go test decision is made during evaluate mode at TP-1 time in this sub-mode.

Entry into sub-mode 3 SM-3 is always from SM-2. Departure from this sub-mode to sub-mode 0 is dependent upon trailing edge of TP-8 on AND gate 1002 in conjunction with either of the following modes: (1) request data, (2) load data, (3) execute, (4) evaluate, (5) store data or (6) send no-go mode. One of the basic functions of this sub-mode step is to set enable time for clocking of character 4 data in the most significant bit positions of functional data registers.

DATA TRANSFER AND DATA TRANSFER CONTROL

Transfers of data and control signals are effected via control electronic assembly 501 and interface assembly 502 (see FIG. 5). More specifically, data and control signals are transferred via a data bus associated with external interface 512 utilizing the timing control mechanism 514 and the data transfer control mechanism 513. (Although separate blocks are utilized in FIG. 5 for grouping of the various assemblies, it is to be understood that this is for ease of explanation only and the physical groupings within the test control station may either be centrally located or close to the element in control. Accordingly, data transfer control network 513 is shown in all of blocks 501, 502 and 505. Similarly, station display and control 519 is shown in separate blocks 501, 502 and 505. Other elements may be similarly included). Data transfer networks are well known in the computer art and any suitable type may be utilized for this invention. A typical data and control signal transfer network is described in detail in U.S. Pat. No. 3,715,727 entitled "A Data Pooler System" and issued on Feb. 6, 1973.

Referring to FIGS. 6, 11, 12 and 13, the addressing, data transfer and interface mechanisms are described. Each data group 1201 within a message consists of four discrete characters 1 through 4 comprised of 6 bits each (disregarding any bits such as parity which may be employed up to external interface). A total of 16 address groups are available (see FIG. 13). Groups are numbered 00 through 17 (octal). Each character is identified in sequence as follows:

1. Character 1 indicates the group address data and is loaded into group address register 1202 during sub-mode 0 (SM0); it selects which line address register 1201 is to be utilized.
2. Character 2 indicates the line address data and is loaded into line address data register 1204 during sub-mode 1 (SM1); it selects which set of functional data registers 1207, 1208 are to receive characters to be enforced.
3. Character 3, also referred to as data word 1, comprises the first 6 bits of functional data to be entered into registers 1208 enabled by the data contained in characters 1 and 2.
4. Character 4, also referred to as data word 2, comprises the last 6 bits of functional data to be entered into registers 1207 enabled by data contained in characters 1 and 2.

Referring to FIG. 13, it will be noted that there are a total of 16 address groups available. Groups are numbered 00 through 17 octal. When a particular group is selected by the group address, in group address data register 1202 via group address decoder 1203, that particular group output line enables a specific line address register 1204. Line address register 1204 which contains line address data 00 – 77, enables 1 of 64 lines numbered 00 through 77 octal. This selected line in turn enables characters 3 and 4 to be loaded into a specific set of functional data registers 1207, 1208 by the gating data clock signal applied to AND network 1206. The output from the functional data registers is utilized for a variety of functions such as programming commercial equipment, establishing bit patterns into the unit under test (UUT) pins to be more fully discussed infra.

INTERFACE MODE CONTROL

Figure 6:
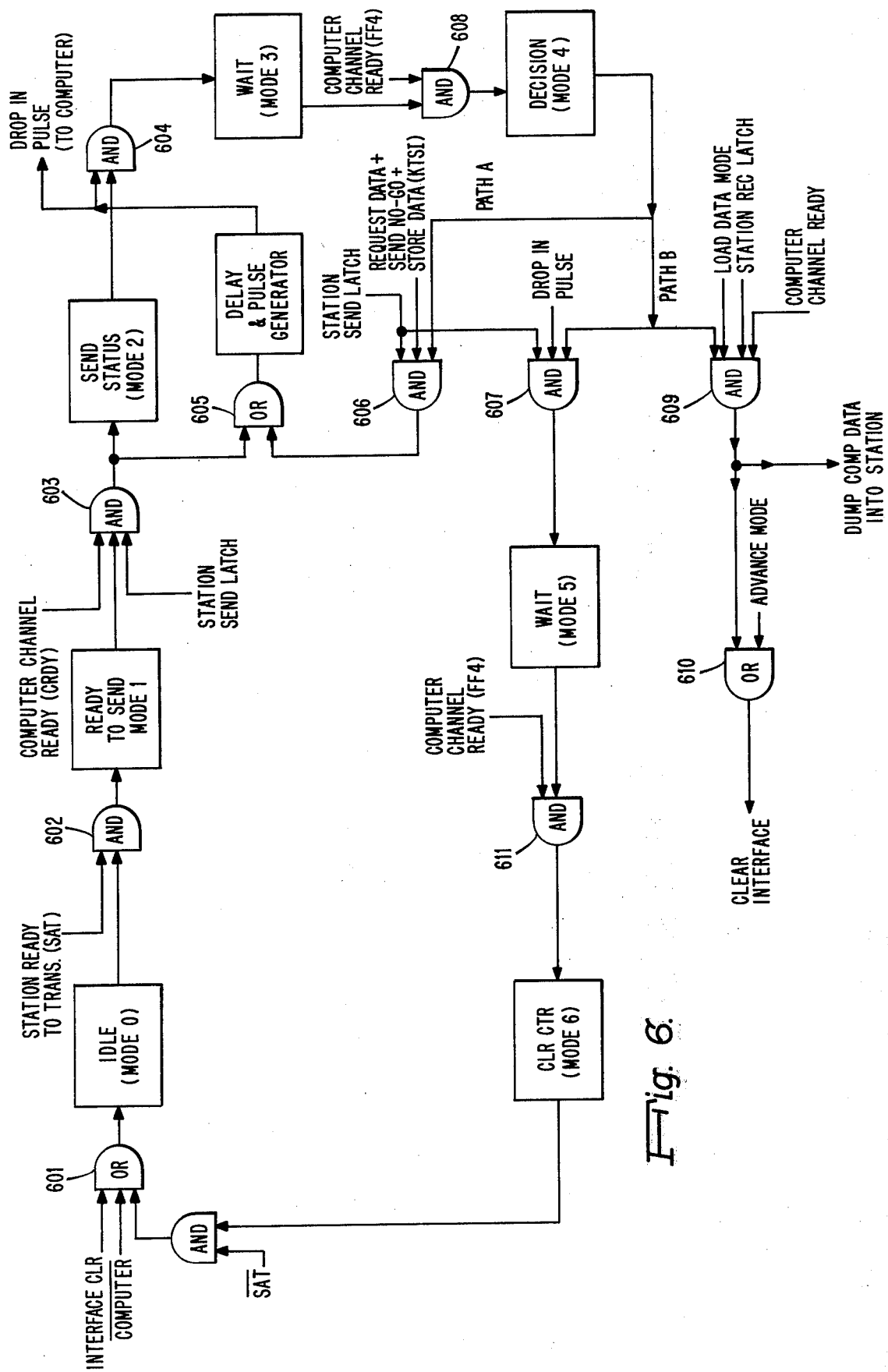
FIG. 6 is a logic block diagram for the computer interface mode control.

Referring now to FIG. 6, the sequence of events of the interface unit 512 in data transfers is as follows:

a. Idle — when no transfers are taking place between the test station and the computer, the interface will return to this mode. This is indicated by the application of an interface Clear signal or a computer Not signal on OR network 601. In order to advance the next mode, the station ready to transmit SAT signal becomes active. This signal is generated by the test station requesting to send data (RTS1).

b. Ready to send — when an enabling SAT signal is applied to the AND network 602 that particular station enabled is ready to send data to the computer; however, the station must wait until the computer is ready to receive data. When the computer is ready to receive data, a computer channel ready (CRDY) signal enables AND network 603 at which time the mode control advances to send status.

c. Send status — in this mode a 16 bit data character from the test station 500 is placed on the parallel data lines to the computer. This character includes station identification number, front panel description (control positions), mode identification (No-Go data, request file, request next block, no-go record, stored data and continue testing). Test number identification, file number identification, test number and file number ID refer to information which is furnished via thumb wheels 508a in the control panel 508.

When the data is sent by the sending unit, a data transfer control 513 enters the wait mode via AND network 604. At the same time a drop in pulse is sent to the computer 503 to indicate this idle mode.

d. Wait — the computer data transfer control network 513 will stay in this mode until the computer responds with a channel ready signal (FF4) applied to the AND network 608 to indicate that the data sent to it has been received and entered into the central processing unit CPU.

e. Decision — in this mode, two routes may be taken. The route taken depends on whether or not the station is to send data to the computer or receive data from the computer. When the station sends data to the computer, the data is present on the data bus, and a station send latch signal and drop-in-pulse signal applied to AND gate network 607 signals the computer to take the data; then the interface advances to wait mode.

There are basically five sources of data for the automatic test station 500. Data is provided from the thumbwheel switches 508a, the computer 503, the paper tape reader 507, the display panel 510 and commercial instrumentation readout from the test head assembly 504. During normal operation, the test station advances into a mode that requires data to be sent to the computer, the RTSI line becomes active. (See FIG. 11). As described previously, this occurs during request data, send No-Go or store data mode. At the time RTSI signal is enabled, the test station 500 starts to unload the data into the computer interface 512. During sub-mode 1 (SM1) and time period TP-8 (see FIGS. 8 and 9) 16 bits of data are entered into the data buffer 1101. This sets the station ready latch 1113 and generates an interrupt signal to the computer. The computer interface 512 advances to the ready mode. And at mode time 6 clears the station ready latch 1113. The destination ready line from AND gate 1106 will go high causing the station to unload another 16 bits of data. However, this time the station will stop in submode 3 and TP-8, and the entire process above will be repeated until all the station data is unloaded.

When the station interface advances into the load data mode, the station ready latches set, causing an interrupt as previously described. The computer interface 512 generates DNP signal at mode 4 time. This DNP signal causes the clock control counter 1105 to generate a dump data and buffer clock signal, which in turn clocks the computer data into the serial parallel register 1101. Sixteen clock pulses are then generated on both the buffer clock line and the external clock line which are utilized to transfer the block data into the test station 500. At the end of the sixteenth clock cycle, the test station is in SM1 mode and TP-8 time period, if it is the first block transfer, or in SM3 and TP-8, if it is a second block transfer. These signals generate an EOL signal via OR gate 1112 and AND gates 1111 and 1107 respectively which in turn disables the clock control of 1105 until more data is ready to be shifted in. This process is repeated until all data for a discrete test block is transferred to the test station; then an advance mode signal from the computer advances the station master mode control cycle.

Internal Memory

The internal memory 515 is utilized as a buffer store to store data received from units attached to the test station 500 such as paper tape reader 507 and the computer 503. Since testing is executed at a rate which is about 10 times faster than can be achieved through the computer, interface buffering of this data in the internal memory 515 is necessary. The internal memory is comprised of MOS semiconductor devices and requires refresh timing signals in order to retain the stored data. A description of such a memory is given in U.S. Pat. No. 3,760,379 issued on Sept. 18, 1973 and entitled "Apparatus and Method for Memory Refreshment Control" and assigned to the same assignee as the instant application.

Unit Under Test (UUT) Stimuli

UUT stimuli categorize the 2 general functional groups analog and digital. Either or both types are employed to satisfy a particular test requirement. UUT analog stimuli are obtained from either one or both of two pulse generators 545, 546 respectively and/or from waveform generator 544. (Pulse generators and/or waveform generators are commercially available from such typical manufacturers as Wavetek). Referring to FIGs. 5, 15 and 16, it will be noted that pulse generator 545 or pulse generator 546 may be connected to either one of two stimuli nodes C or D. From either of these nodes, any one of 12 lines may be selected throughout stimuli to board adapters on test head 504. Program data for pulse and waveform generators is actually applied as the test station progresses from load data to execute mode. The routing relays remain closed from one test cycle to the next unless a particular relay program control group is being addressed for data loading, in which case the effected relays will be disabled only while the group is being addressed.

Digital stimuli may take one of four forms: (1) a standard digital input from unit 526; (2) special stimuli input from unit 524; (3) UUT clock input from unit 523; or (4) UUT word input stimuli also from unit 523. Regardless of form of stimuli input involved, the actual application of stimuli occurs at the time of entry into execute mode delayed by the amount of test delay which may be programmed. The timing of the application of digital with respect to various modes such as clear, request data, load, execute and evaluate and also with respect to submodes is shown on FIG. 17.

Referring to FIG. 5 and FIG. 17, a standard digital input which is TTL compatible is applied to any one of 256 lines (128 per side) of test head 504. Selection of a particular line as an input is program controlled to enable a selected line as previously described in reference to FIGS. 12 and 13. Digital inputs are serially applied to a selected line in a pattern of high and low signals representing 1's and 0's. Depending on the number of stimuli clock pulses in the rate program, a predetermined bit pattern on the line may be serially shifted to the input/output matrix 550*a*, 550*b*. Typically, the maximum number of stimuli clocks programmable is 4095 and that number of bit shifts is possible on an input line. Stimuli clock rate is programmable up to 5 MHz and it is this rate which determines the rate at which bits in a predetermined bit pattern progress to the input pin.

Twelve special stimuli lines to each side of the test head 504, are provide from special digital stimuli unit 524. These stimuli lines are basically the same as the standard digital stimuli lines with the exception of the "1" and "0" levels. Where standard digital line levels are TTL compatible, the "1" and "0" level of these lines is programmed within the range of −36 volts to +36 volts with the following stipulations: level program for "0" state must be at least 0.5 volts more negative than level program for "1" state. The 24 special stimuli lines are further divided into 3 groups of 8 lines with each group having capability of being programmed for a different "1" and "0" level.

There is one UUT clock line which is available per side of the test head 504. This line is TTL compatible and is basically a buffered fixed width version of the stimuli clock. (See FIG. 17). The rate and number of clock pulses available on the line are both programmable, with the same maximum specified for a standard digital input. The rate selected here is the same rate employed for a stimuli clock pulse on FIG. 17 and therefore is used for clocking the standard digital line. The number of clock pulses however are independently programmable.

There is also one UUT word line per side of the test head unit and this is also TTL compatible. The signal is a programmable 64 bit serial word. The bits are clocked out of UUT word line at the stimuli clock rate with the number of clock pulses being the same as that for the UUT clock line as previously discussed. The pattern is automatically recirculated.

UUT Measurement

UUT measurement is also categorized into 2 general functional groups — analog and digital. Either or both types may be utilized to satisfy a test requirement. UUT measurements are accomplished by using any one of 3 commercially available measuring devices as follows: (1) an oscilloscope system 541 which may typically be of the Tektronix type 568; (2) a multimeter 542 which may typically be a John Fluke type 8200A; and (3) a timer counter 543 which may typically be of the Hewlett-Packard type 5326A. Referring once again to FIGS. 15 and 16, the input terminals of any of the 3 measurement devices are connected to either of measurement nodes A or B. A in turn is connected to any one of 6 probe lines routed to the left side of the test head or to any one of the 6 probe lines connected to the right side of test head 504. Similarly, node B is connected to any one of 6 probe lines on the left side of test head 504 or to any one of 6 probe lines on the right side of test head 504. The timing diagrams for the counter, scope and multimeter are shown on FIGS. 19, 20 and 21 respectively.

Referring to FIGS. 18 and 19, the timer counter operation is as follows: when the execute mode is entered by the test station and the test delay pulse (if programmed) and the fault analysis probe (if programmed) has completed its movement, a hundred microsecond wait period is initiated. Following the wait period, if the counter enable line is programmed, the counter is triggered to initiate a measurement. When the counter measurement is completed, the counter, via the printed command, signals the test station that measurement has been completed and readout data is now ready for comparison. (The print command generates a "print data ready" signal in the station). A comparison is made at this time between the programmed upper and lower limits and actual counter measured value and a Go/No-Go decision is made. The print data ready signal previously mentioned supplies a gate signal to enable the test station to move from the execute to evaluate mode. If the results were Go, the station will move from the evaluate to the request data mode unless this was the last test whereupon the test station will go to store data mode. If the test results were No-Go, the station will move to send No-Go and read out from counter will be transferred to the computer.

Multimeter measurement may be programmed for external triggering and multimeter enable signal rather than counter enable. The operation of the multimeter has identical timing and sequence to that described with respect to the counter measurement. If external triggering is not programmed, then repeated multimeter measurements are made. (See FIG. 21). During normal operation, program data is transferred to the multimeter when the test station 500 leaves the load data mode. However, if triggered entry of program data into the multimeter is desired, external command entry is programmed. In this mode, entered data is stored in the multimeter, and programmed data will update only when the trigger is supplied.

Oscilloscope measurement is entered by test station upon a plus trigger enable signal. (See FIG. 20). A single measurement is then made coincident with the first positive sync signal supplied to scope. Program data, including upper and lower limit data, is applied to the scope system immediately upon entry into execute mode by the test station 500. Upon completion of measurement by the scope 541, a print command signal is generated to the station which then initiates a print data ready signal which permits the strobing of limit lines. Based on the condition of these lines, the analog input and output unit 527 evaluates the circuit for use in Go/No-Go determination at TP-1 time and SM-2 sub-mode in the evaluate mode. D ring this normal operation, only 1 measurement per test is made; if it is desired to repeat scope measurements, the triggered recycle line is programmed.

Power Supply and Control

There are generally 2 types of power supplies in the test station 500 — station power supplies 547 and unit power supplies 548. They are commercially available from such manufacturers as Lambda. The station power supplies 547 have set outputs. Power supplies for the UUT are programmable power supplies and are comprised primarily of 8 units PS-1 through PS-8. The power supply monitors and controls 521 for power supply units PS-1 through PS-8 are shown on FIGS. 22 through 26. Power supplies have provisions in test panel 511 for monitoring outputs continuously. There is also illuminating power supply for monitor lamps on the control panel 508 which light if the power supply output falls below set limits.

Figure 22:
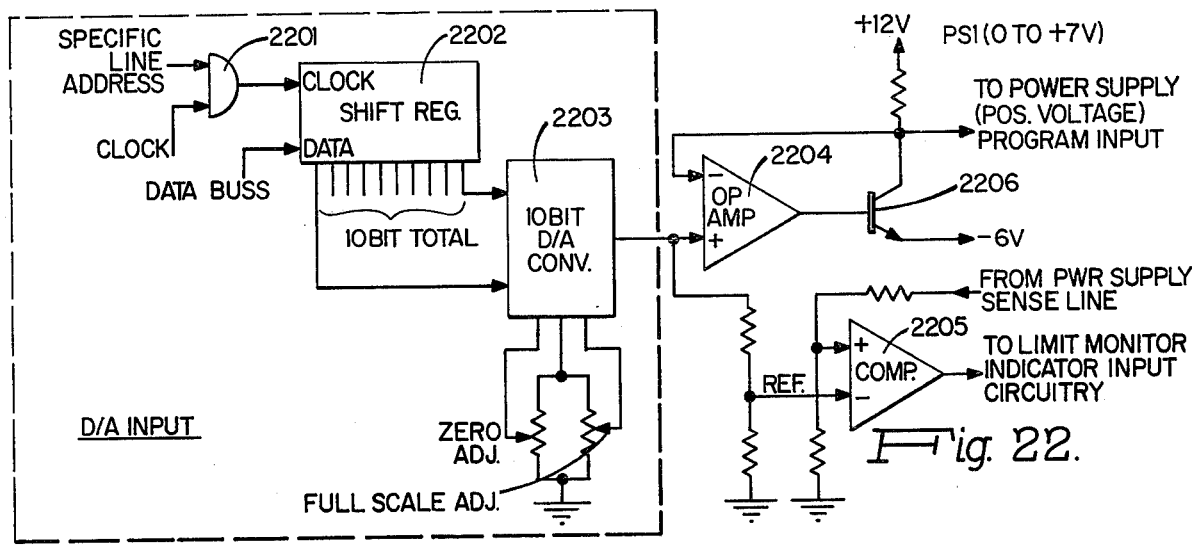
FIGS. 22–26 are schematic diagrams of the power supply controls for power supplies PS1 through PS8.

Referring to FIG. 22, a digital-to-analog converter 2203 is programmed via a 10 bit shift register 2202 to provide a programmed input voltage to power supply 548 via op amp 2204 and transistor 2206. The output of the power supply 548 (FIG. 5) is compared against the programmed input voltage in comparator 2205 to obtain a low limit signal.

Figure 23:
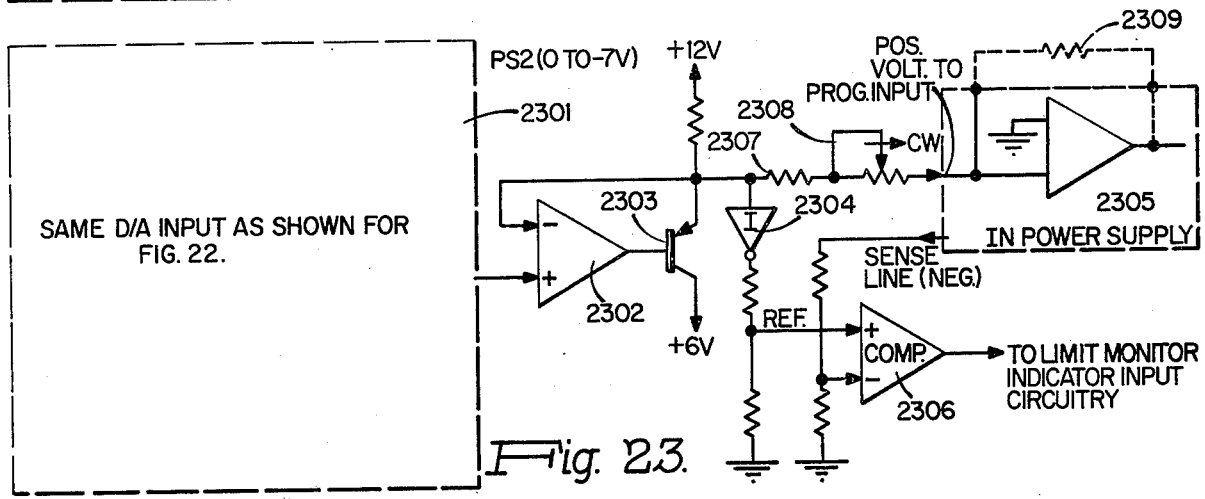

Referring to FIG. 23, the control PS-2 is essentially the same control as for PS-1 except that the output from the power supply is negative and the programmed voltage is a positive polarity necessitating inversion of the programmed voltage in inverter 2304 prior to the application of the voltage comparator 2306. A series source resistive network of 9.1 Kohm resistor 2370 and a 2 Kohm potentiometer 2308 are provided to allow matching to a 10 Kohm feedback resistor 2309 in order to ensure a power supply gain of 1 to 1 i.e. 1 volt in per 1 volt out. The range of voltage available from PS-2 is −0 to 7 volts.

Figure 24:
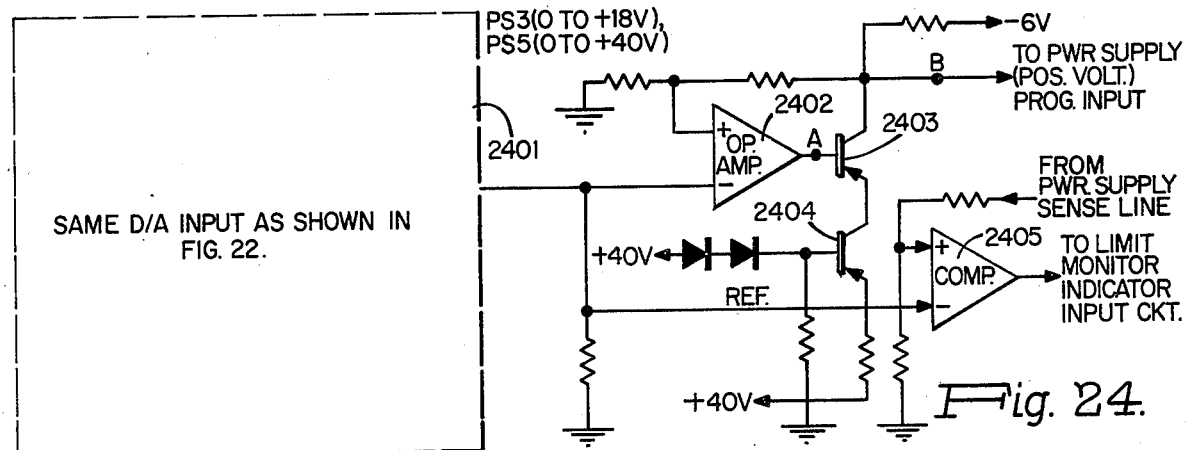

Referring to FIG. 24, power supply control unit PS-3 and PS-5 are shown which are similar to power supply control unit PS-1 with the exception that op amp 2405 is wired for a gain of 4 i.e. 1 volt in for every 4 volts out. PS-3 control provides a range of 0 to +40 volts.

Figure 25:
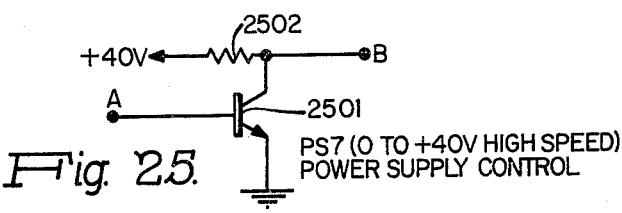

Referring to FIG. 25, there is shown a portion of the power supply control PS-7 which is similar to FIG. 24 with the exception that the circuit of FIG. 25 is substituted for the similar circuit 2403 in FIG. 24.

Figure 26:
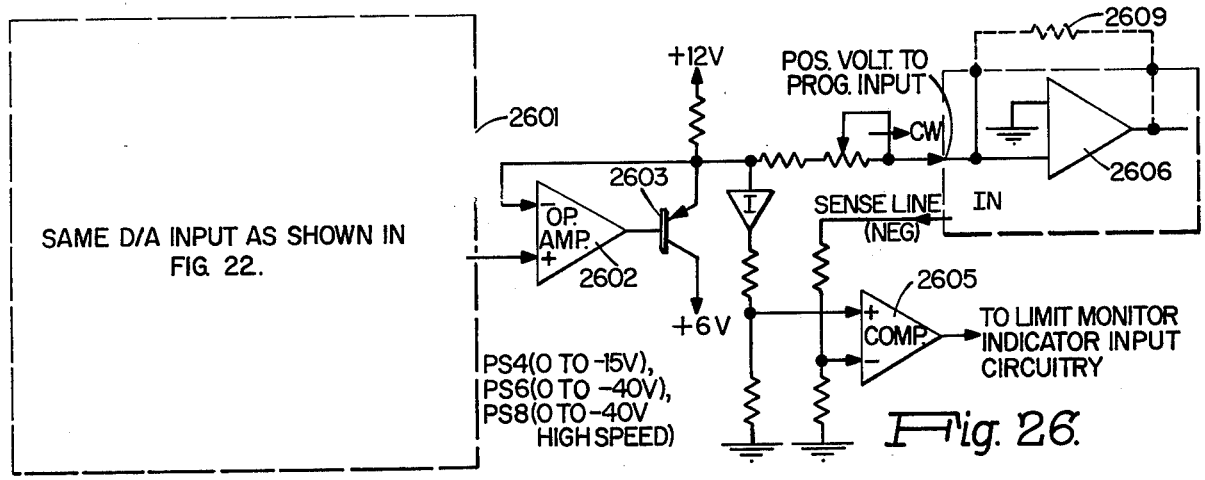

Referring now to FIG. 26, there is shown the power supply control unit PS-4, PS-6 and PS-8. It will be noted that the circuit is the same as the circuit on FIG. 23 except that the feedback network 2605 is set to limit the comparator input to compensate for the 1:4 program to output voltage gain. Even though the series source resistive network is the same as for unit PS-2, the feedback resistor used in the power supply is 39 Kohms, which provides for a 1:4 gain.

Test Head Assembly

Figure 27:
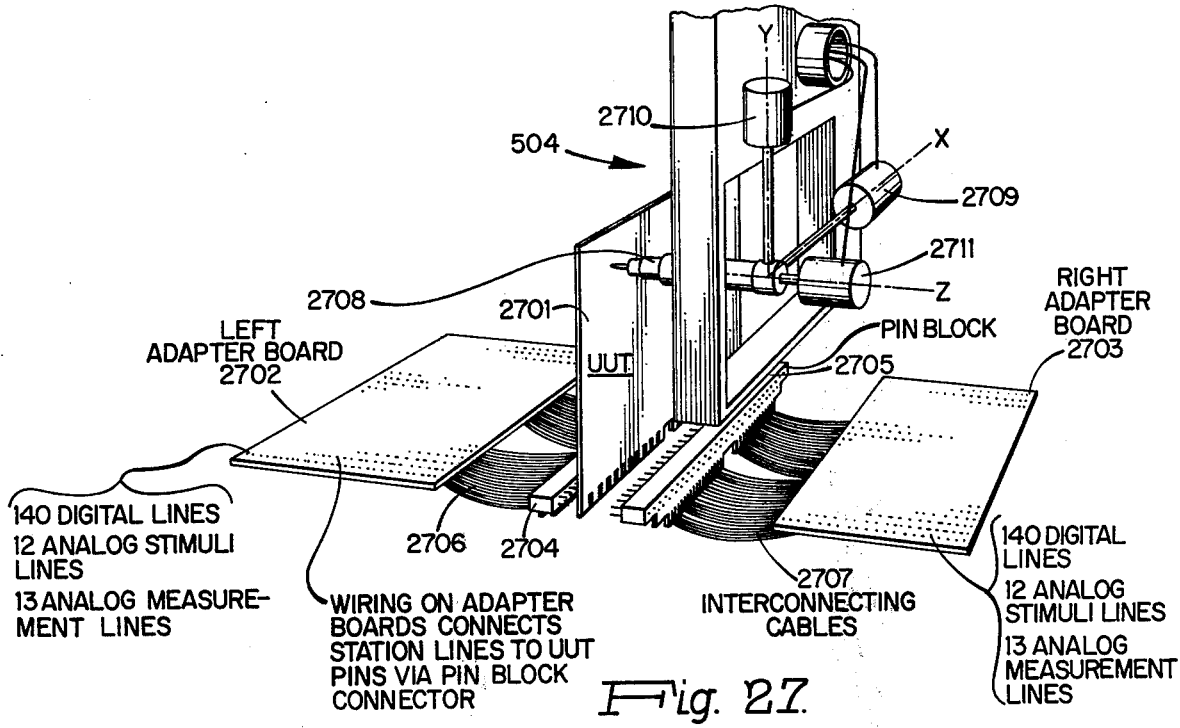
FIG. 27 is an exploded diagram of the test head assembly.

Referring to FIG. 27, there is shown an exploded schematic of the test head assembly 504 of FIG. 5. The unit under test UUT 2701 is a printed circuit board under test by the test station 500; it is not an integral part of the test head but is included in FIG. 27 to show its relationship relative to the test head assembly. The adapter boards 2702 and 2703 respectively connect the test station line through pin blocks 2704 and 2705 to the unit under test UUT 2701. There are 2 adapter boards, a left adapter board 2702 and a right adapter board 2703 one on either side of the test head. The adapter boards are wired for a specific style printed circuit board and may typically contain electronic components needed for the test sequence. The interchangeable pin blocks 2704 and 2705 have different spacing between adjacent pins to allow the test station to accommodate many styles of printed circuit boards. Interconnecting cables 2706 and 2707 connect the adapter boards directly to the pin blocks 2704 and 2705 respectively which in turn apply analog and/or digital stimuli to the UUT under program control. Conversely, measurement signals are picked up via the pin blocks and distributed through adapter boards to the measurement instruments. There are a total of 280 station lines (140 lines per side) which are numbered 000 to 279 (decimal) and are selected for each discrete test step to perform a specific function by the machine test language statement. For example, a group address 04, line address 02, data word one or 01, and data word two or 02, will cause line 011 to be examined for a "1." Each station line may be used either for input to or output from the unit under test.

A moving probe assembly 2708 comprised of a standard model 1124A Hewlett-Packard type probe provides high voltage, high impedance, general purpose probing capabilities for 50-ohm input, high frequency instrumentation. The position of the fault analysis probe 2708 is controlled by 3 stepping motors 2709, 2710 and 2711 which provide X, Y and Z movements to the probe respectively — one motor being used for each access of movement. The X and Y access motor speeds are accelerated at the start of movement of decelerated before the completion of movement in order to prevent positional error. Maximum fault analysis probe speed in the X and Y access direction is 1.8 inches per second. The Z access motor, is used to position the probe in and out from the UUT and is driven at constant speed. Probe speed in the Z direction is 4.2 inches per second. The probe quickly positions itself on a designated X and Y coordinate of a UUT within 0.005 inches. Limit switches prevent probe travel in the event that a malfunction occurs or an incorrect probe position is programmed which result in damage to the hardware. The fault analysis probe is utilized to perform measurements of signals in the 40 millivolt to 40 volt range and has a frequency response from D.C. to 35 MHz. The probe is intended to be used primarily for analog measurements, but is also used for digital high speed diagnostics when operated in conjunction with the H316 Honeywell computer.

A complete test of a unit under test 2701 is performed under a test program control which consists of a sequence of test statements, each of which defines a discrete test step. Referring to FIG. 28, each test statement is stored in one of a group of test registers 2801. Although these test registers are shown in one location on FIG. 28, in the actual test station they are diffused throughout the station and are close to the unit performing the function that they are to control. For example, registers 0000 through 0002 may typically form a group of registers which are closely located to the test head for providing the functions shown in block 2802 i.e. input, stimulation, evaluate, output and response. Similarly, registers 0003 through 0005 are typically located physically close to the probe assembly 2708 to provide the function of probe assembly 2708 to provide the function of probe movement 2803. (It is to be understood that any number of registers may be grouped together in different physical locations and the number selected here are for illustration purposes only).

To perform a single discrete test step, information in the test program is first loaded into the station registers 2801 from the H316 computer 503, the paper tape reader 507 or the internal memory 515 as shown on FIG. 5. The information in the station test registers 2801 control the station functions for each discrete test step. The registers are divided into 16 groups numbered octal 0 to octal 17 and there are 64 lines in each group numbered octal 0 to octal 77. (See detailed description supra in connection with FIGS. 12 and 13). Each statement in a test program consists of 4 characters (as previously described in connection with FIGS. 12 and 13), the first character 2806 defines the group address 0 to 17 octal whereas the second characters 2807 defines the line position 0 to 77 octal of that group of registers. The third and fourth characters 2808 and 2809 define the data that is in register address. The address decoder 2810 enables one of several lines thus routing the data into the selected register.

A typical logic circuit for routing signals to various lines is shown on FIG. 29. Information is shifted into a selected line address via AND gate 2901 under data shift clock signals, from the data bus into register 2902 and 2903. The data is decoded utilizing 1 of 16 type decoders 2904 and 2905 to enable 1 of 32 lines 2906. Data and/or other signals are provided to the enabled line by amplifier 2907 and coaxial relay solenoid 2908. An AND gate 2909 is enabled when addressing is terminated and data is provided to the display output. This circuit may typically be used for ac stimuli, ac measurement, sync, general trigger and general gate routing shown in block 517 of FIG. 5. It may also be used, with minor modifications, for scope, multimeter, counter, pulse generating, waveform generator and dc signal routing shown in block 518 of FIG. 5.

Fault Analysis Probe Control

Figure 30:
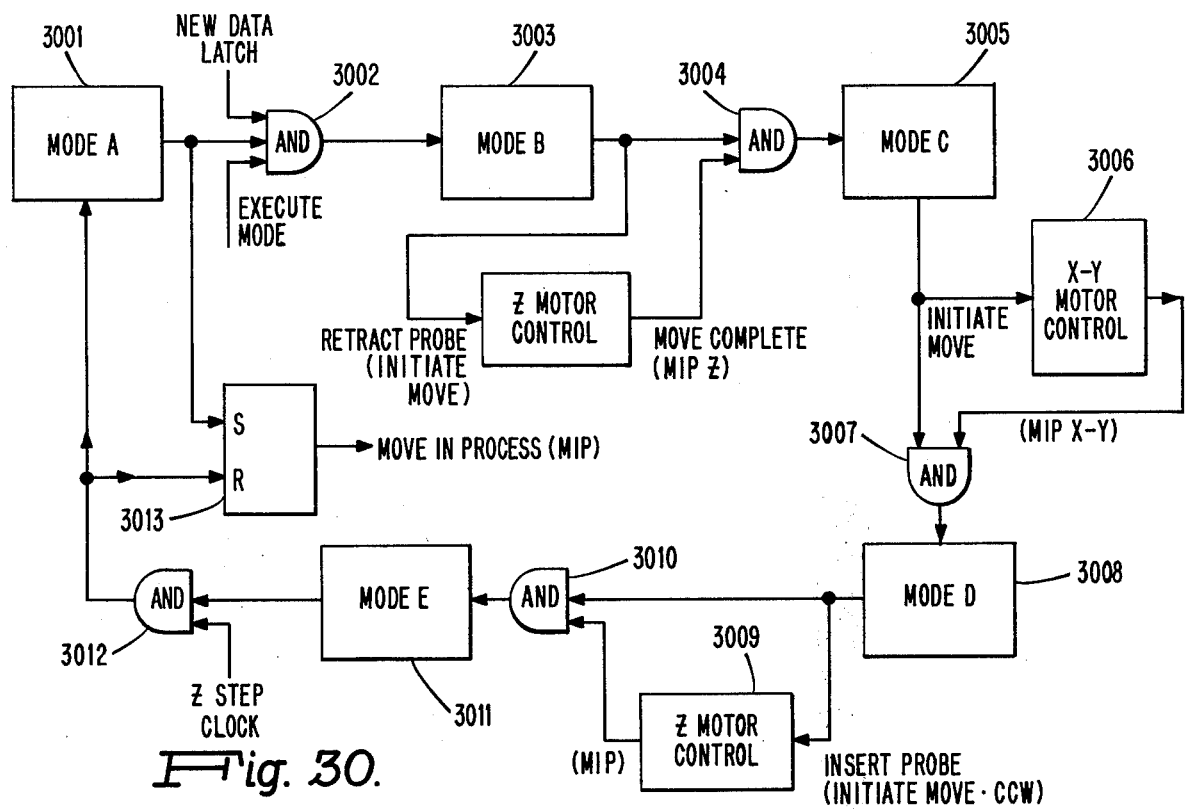
FIG. 30 is a logic block diagram of the moving probe mode control system.
Figure 31:
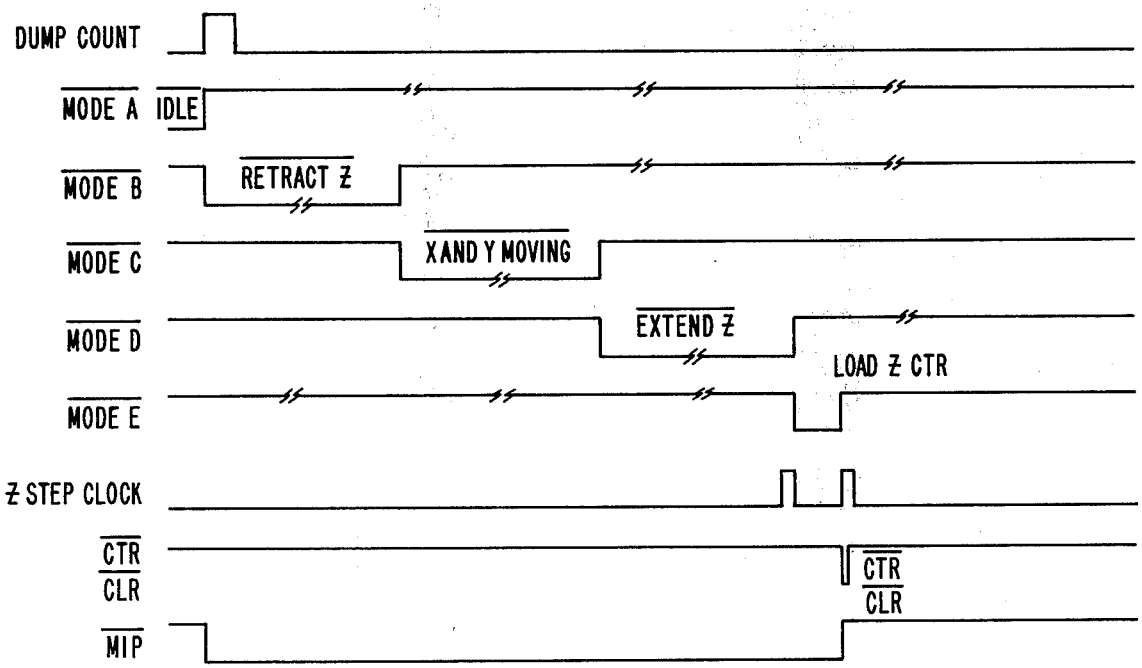
FIG. 31 is a timing diagram of the moving probe mode control system.

Referring to FIGS. 30 and 31 there is shown a logic block diagram for the moving probe mode control and a timing diagram for the moving probe control. Mode A 301 is the idle mode previously described. Mode B is the retract probe in Z direction Mode and is entered from Mode A via AND gate 3002 upon the presence a new data latch signal and an execute mode signal. Mode C 3005 is the X and Y moving probe direction and is entered from Mode B via AND gate 3004 when the Z motion of the probe is complete and applies a signal to AND gate 3004 in conjunction with the Mode B signal. Mode D 3008 is the extend probe in the Z direction mode and is entered from Mode C via AND gate 3007 upon the completion of the XY motion of the probe. Mode E 3001 is the load Z counter mode and is entered from Mode D after the completion of a move and process. Finally the cycle is complete and Mode A, the idle mode, is entered via AND gate 3002 from Mode E upon the application of a signal from the Z step clock.

Figure 32:
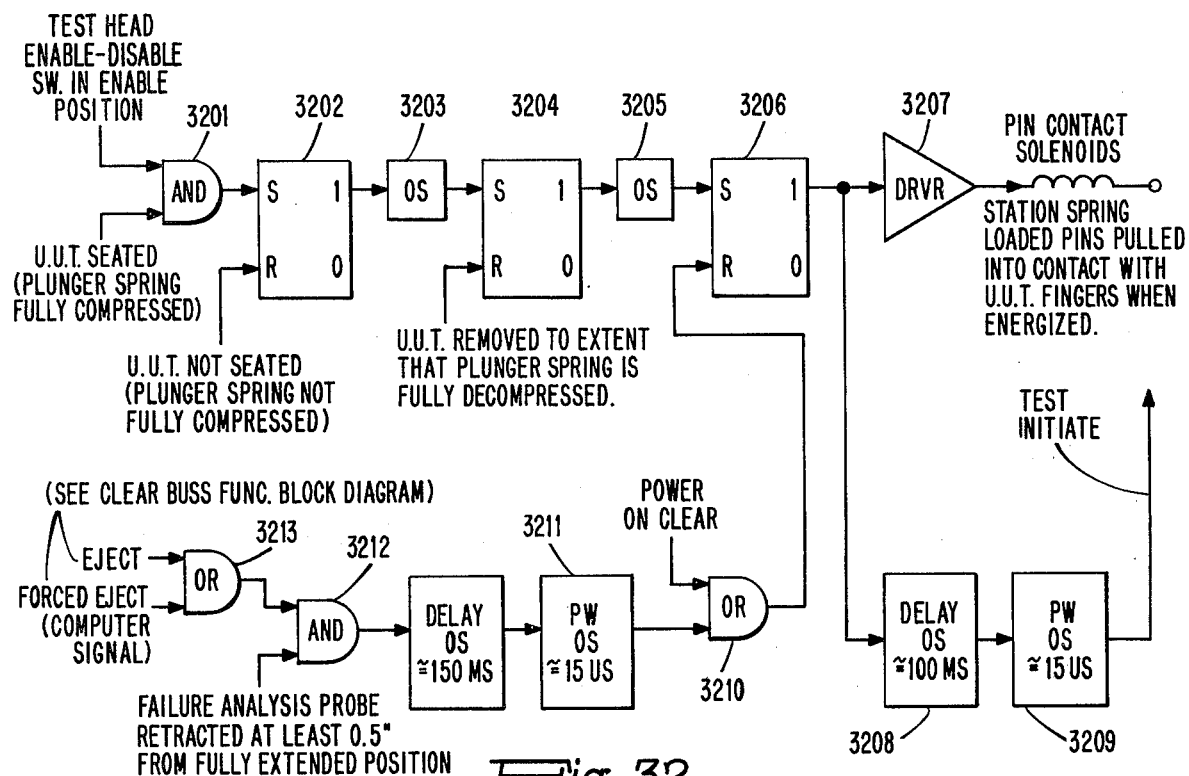
FIG. 32 is a logic block diagram of the test head control system.

FIG. 32 shows the logic block diagram for the test head control. The act of inserting a UUT into the test head causes the UUT seated plunger to apply a high logic level to AND gate 3201. When the front panel TEST HEAD ENABLE-DISABLE SWITCH is in the ENABLE position, AND gate 3201 causes latch 3202 to set. Setting latch 3202 causes latches 3204 and 3206 to set in succession after delays given by one shots 3203 and 3205 respectively. When latch 3206 sets, driver 3207 is turned on causing the PIN CONTACT solenoid to energize, thus connecting the board under test to be connected to the test station. Latch 3206 also causes a TEST INITIATE signal to be produced via delays 3208 and 3209. The TEST INITIATE signal causes testing to begin.

When testing is completed an EJECT signal is produced by OR gate 3213 and is passed through AND gate 3212 and delays (3211 etc.) to clear the latch 3062. Clearing this latch releases the pin contact solenoids thus releasing the board under test; then causes latch 3204 and 3202 to reset.

Figure 33:
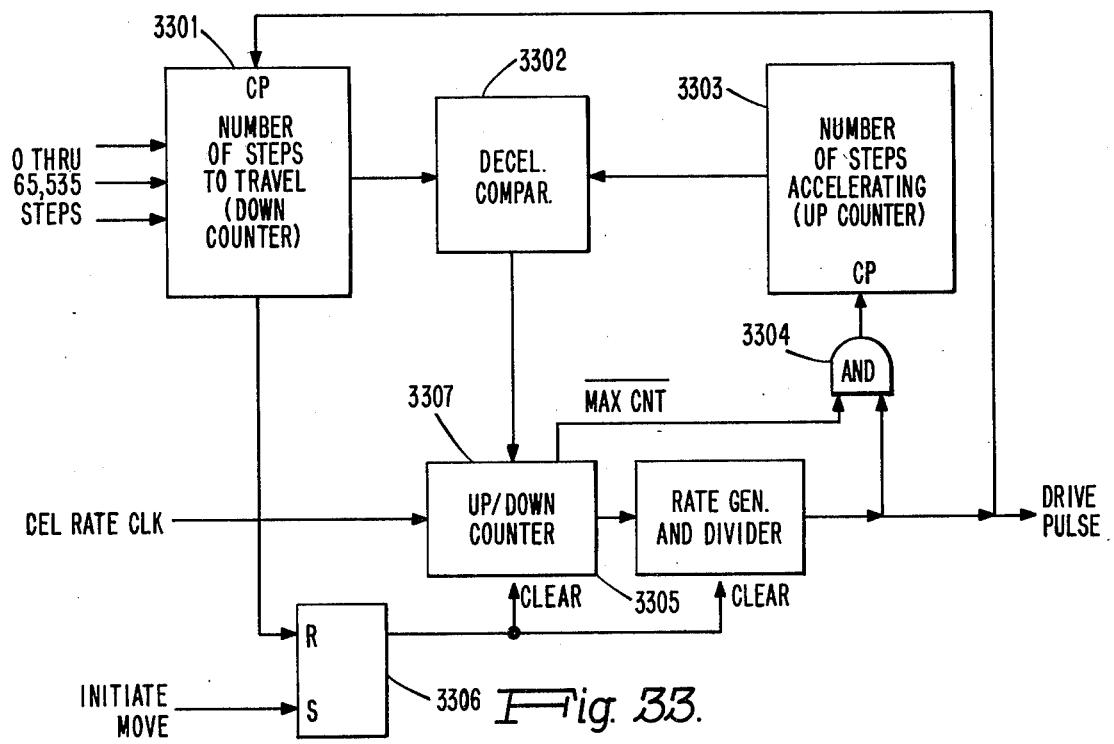
FIG. 33 is a block diagram of the stepping motor control system.

FIG. 33 shows the logic block diagram for moving the fault analysis probe in one discussion. Initially block 3301 contains the difference between the actual probe position and the desired position and the initiate move signal sets latch 3306. Setting latch 3306 permits a rate clock to be counted by counter 3307 and rate generator 3305. The rate generator output produces the stepping pulses (drive pulses) that causes the probe motion. These pulses also increase the count in up counter 3303 via gate 3304 until 2 max count rate is reached. Then pulses also are counted by down counter 3301, thus giving distance to go. The up counter causes the rate generator to accelerate smoothly up to a maximum rate and the down counter causes to declerate via the decel compare (block 3302) as the correct position is approached. When the down counter 3301 is empty (=0), latch 3306 is cleared, thus ending the probe motion.

Figure 34:
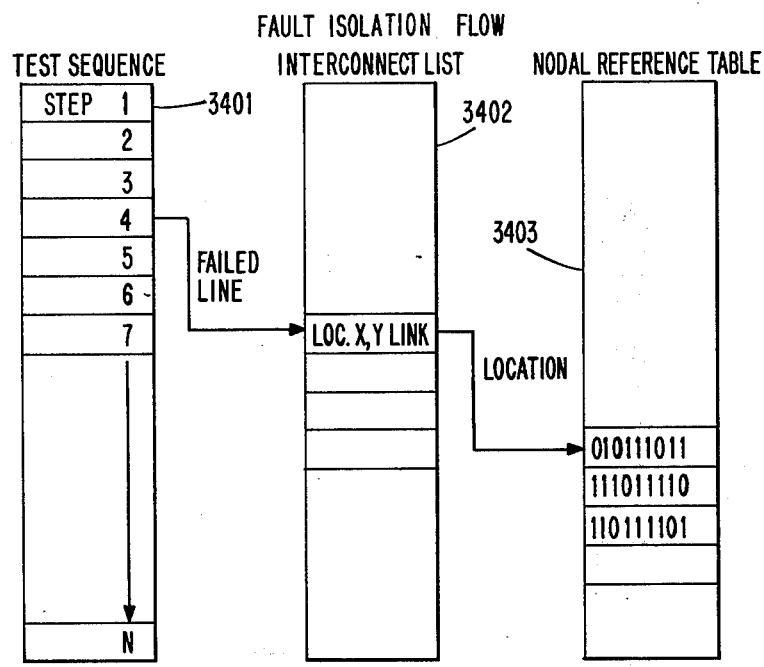
FIG. 34 is an interconnecting diagram of the programs and files utilized to automatically drive the test head.
Figure 36:
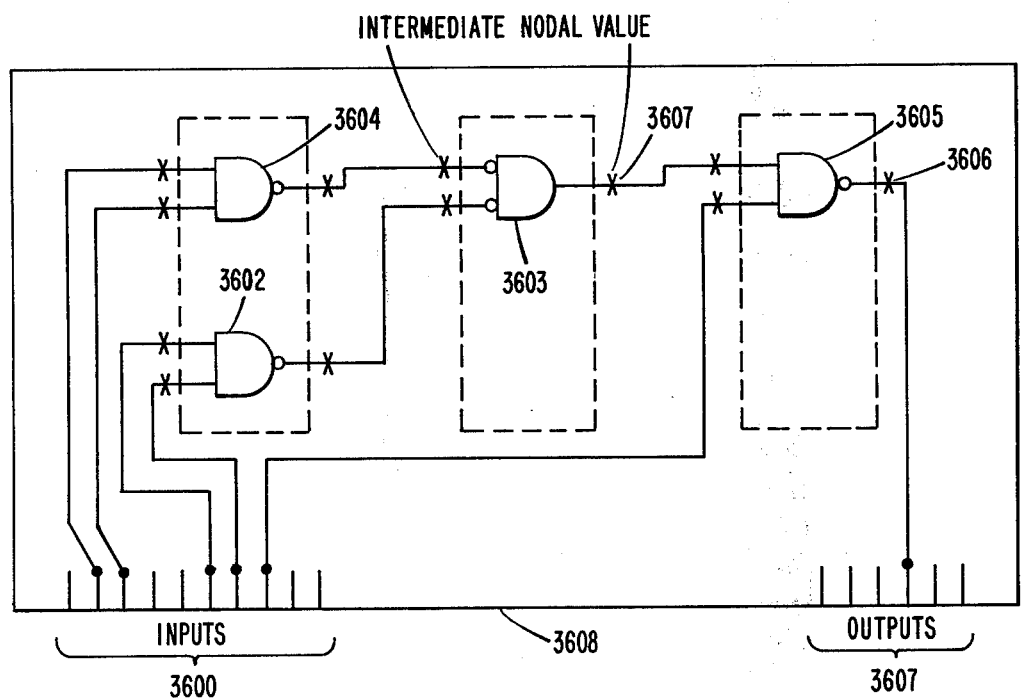
FIG. 36 is a diagram of a prior art circuit board utilized in illustrating the fault isolation system.
Figure 35:
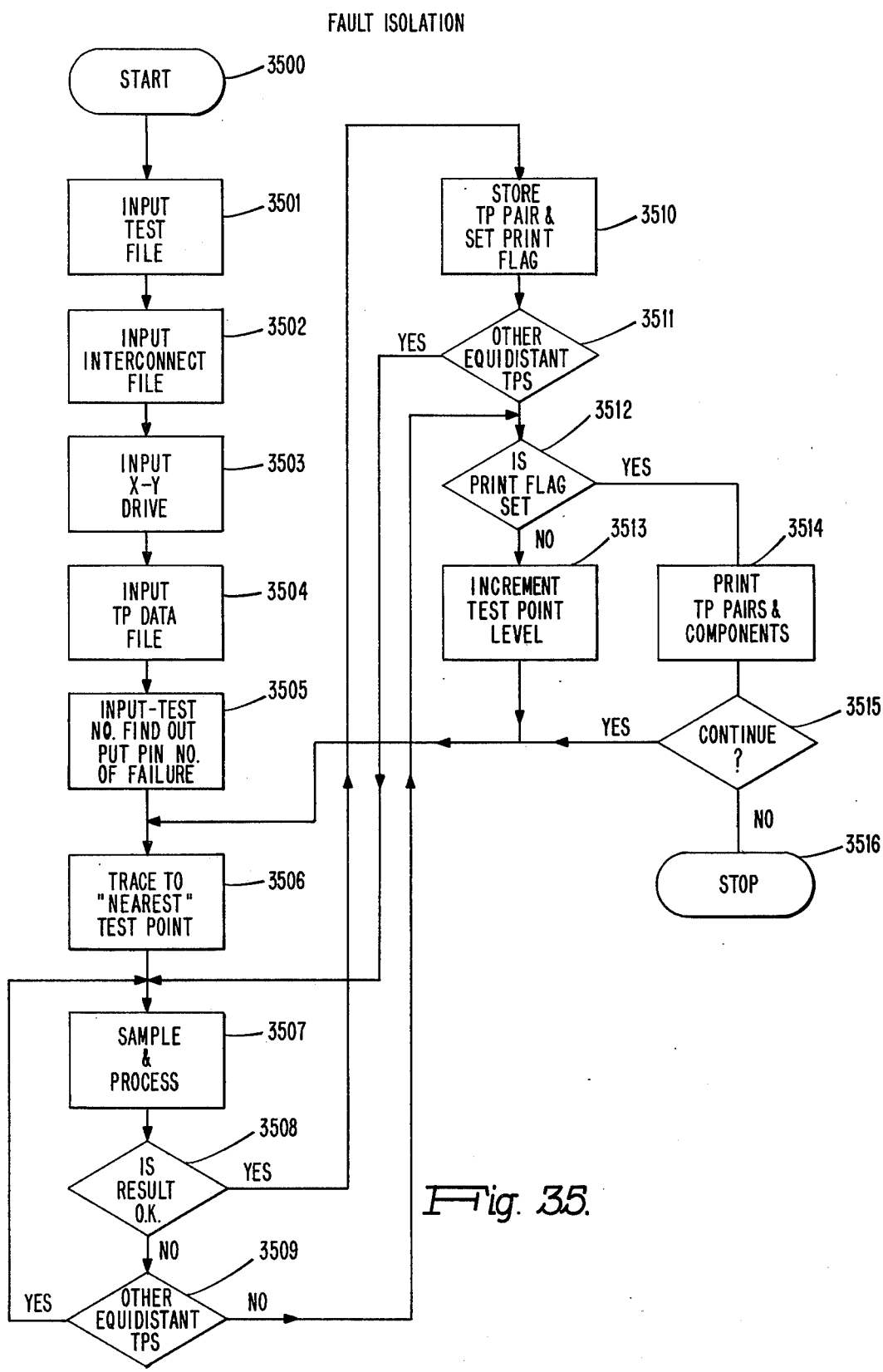
FIG. 35 is a flow diagram of the fault isolation process.

To illustrate further the operation of the fault analysis hardware, refer to FIGS. 34, 35 and 36. As previously discussed, the fault analysis probe is under program control utilizing test files, interconnect files and nodal reference files. The test file contains the input patterns converted to the test station's object language and drives the tester. The nodal reference file contains a calculated or empirically derived table of events for each given node in the network with respect to the input patterns imposed. The interconnect file contains the to/from network connections of the various elements, and where possible, the node identification for a given fault signature. The operating program allows the performance of Go/No-Go test and automated fault isolation using the software controlled moving probe with provisions for operator intervention. In a fully automatic mode, the system proceeds through test and fault isolation and notifies the system operator of the element or elements that failed.

The operation of the program controlled fault isolation and test system is described utilizing FIGS. 34, 35 and 36. Referring first to FIG. 36 the fault analysis probe begins at the output terminals 3607 of a typical "failed" printed circuit board 3608. Utilizing the interconnect file for this type of a printed circuit board the fail probe is driven to the first node 3606 of a typical element 3605 of the circuit board. Point 3606 is referred to in the interconnect file in terms of X and Y coordinates, and it is these X and Y coordinates when decoded into appropriate signals that direct the probe to node 3606. (See FIG. 33). The probe is then lowered in the Z direction to make contact with node 3606 when the probe has finished its X Y travel (see FIGS. 30 and 31). The input terminals 3600 are then stimulated with the appropriate electrical stimuli and the result compared with the true results supplied by the nodal reference table for that location.

Referring to FIG. 34, a group of registers 3401 hold the test sequence; another group of register store the interconnect file giving the X and Y location of the various nodes for that particular printed circuit board under test; and still another group of registers 3403 store the true test value for the location under test which is linked to that value by a link data. If there is no comparison as in this example, an indication is given that particular fault node is in effect the failure node. If there is comparison, the probe continues to the next node 3607 and so on until a failure is detected by a no-comparison between the node under test and the nodal file.

FIG. 35 is a flow chart which shows a typical fault isolation process. The basic starting point 3500 through 3505 shows steps which load the required data into a group of registers 3401-3403. The first step of the actual fault isolation is shown in block 3506 where the probe proceeds to the nearest test point node. All of the tests previous to the test that failed are executed 3507 and a determination is made as to whether or not this is a node in the fault path. If this node is in the fault path, it indicates that it may have one or more failed branches. Accordingly, the probe is driven to all equidistant branches and the test performed all over again to continue the fault path. If, on the other hand, none of the equidistant branches are on the fault path, the last node in the fault path is the failed node, (i.e. the node at which the failure is first evident).

What is claimed is:

1. A fault analysis system for determining the location of a fault in a printed circuit board, comprised of a map of a plurality of electrical paths, each path having a plurality of electrode node contacts that has failed to pass any one of a series of predetermined analog or digital electrical tests, said failure caused by a fault in at least one of said electrical paths, said fault analysis system comprising:
    a. first means for automatically performing a plurality of electrical tests in a predetermined sequence on said printed circuit board;
    b. second means, coupled to be responsive to said first means for detecting a failure of any one of said predetermined series of electrical tests on said printed circuit board caused by said fault in at least one of said electrical paths; and,
    c. third system means coupled to be responsive to said first and second system means for automatically determining the location of the fault on said failed printed circuit board, said third system means including path generating means coupled to be responsive to said second means and to map information signals indicative of the map of the electrical paths of the printed circuit board under test, said path generating means for automatically generating a plurality of path-signals indicative of at least one path within the failed printed circuit board under test wherein a fault is to be found and further including an automatically movable fault analysis probe, coupled for being responsive to the plurality of path-signals, for automatically and sequentially moving along said at least one path within said failed printed circuit board under test for making electrical contact with predetermined electrical node contacts on said at least one path on said printed circuit board under test.

2. The fault analysis system as recited in claim 1 including fourth means electro-mechanically coupled to said fault analysis probe for causing X, Y and Z motion of said fault analysis probe where X, Y and Z are directions perpendicular to each other.

3. The fault analysis system as recited in claim 2 including fifth means coupled to said fourth means for imparting a predetermined initial acceleration to said fault analysis probe in each of the X, Y and Z directions.

4. The fault analysis system as recited in claim 3 including sixth means coupled to said fourth and fifth means for imparting a predetermined final deceleration to said fault analysis probe in each of the X, Y and Z directions, whereby said fault analysis probe is first accelerated and then decelerated to any of its predetermined positions.

5. The fault analysis system as recited in claim 2 wherein said fourth means are stepping motors.

6. The fault analysis system as recited in claim 2 including seventh means in said third system means for storing addresses of the predetermined positions on said printed circuit board with which said fault analysis probe successively and sequentially makes electrical contact.

7. The fault analysis system as recited in claim 6 including eighth means coupled to said first and seventh means for storing the sequence of tests to be performed at each predetermined position.

8. The fault analysis system as recited in claim 7 wherein said eighth means stores the value to be expected from each test performed at a selected one of said predetermined positions.

9. The fault analysis system as recited in claim 8 including ninth means coupled to said first and eighth means for comparing the value obtained from the actual test at said selected one of said predetermined positions to the value stored in said eighth means corresponding to the value to be expected at said selected one of said predetermined positions.

10. A fault isolation system for determining the location of a fault in a printed circuit board comprised of a map of a plurality of electrical paths wherein one or more of said electrical paths contains an electrical fault that has caused said printed circuit board to fail to pass any one of a first sequence of predetermined electrical tests comprising:

a. first means responsive to map-signals indicative of the map of said printed circuit board for automatically generating X and Y coordinate addresses for any one of a set of predetermined contact points on said printed circuit board, an X and Y coordinate address being the intersection of a line of predetermined length on the plane of said printed circuit board in an X direction with another line of predetermined length on the plane of said printed circuit board in a Y direction which is perpendicular to said X direction said predetermined lengths being measured from arbitrary reference lines in the X and Y directions respectively and also in the plane of said printed circuit board;

b. second means coupled for being responsive to said automatically generated addresses in said first means for automatically contacting successively and sequentially each of said predetermined set of contact points, until the fault position has been reached; and, c. third means coupled for being responsive to said first and second means for automatically applying sequentially at each of said contact points a second sequence of predetermined electrical tests.

11. The fault isolation system as recited in claim 10 including fourth means responsive to said third means for evaluating said second sequence of predetermined electrical tests at any of said contact points.

12. The fault isolation system as recited in claim 11 including in said fourth means fifth means for storing a predetermined value for each of said sequence of electrical tests.

13. The fault isolation system as recited in claim 12 including sixth means coupled to said fifth means for comparing said predetermined value of each of said second sequence of electrical tests with the actual value obtained from each of said second sequence of electrical tests.

14. The fault isolation system as recited in claim 10 including seventh means responsive to said first and second means for generating the X and Y coordinate address of said second means.

15. The fault isolation system as recited in claim 14 including eighth means responsive to said second and seventh means for generating the X and Y coordinate address of a next sequential X and Y coordinate address of said set of predetermined contact points relative to the X and Y coordinate address of said second means.

16. The fault isolation system as recited in claim 15 including ninth means responsive to said eighth means for converting said next sequential X and Y coordinate address into a predetermined member of digitial pulses.

17. The fault isolation system as recited in claim 16 wherein said second means includes stepping motor means for driving said second means in said X and Y directions.

18. The fault isolation system as recited in claim 17 including tenth means responsive to said ninth means and coupled to said stepping motor means for counting the number of digital pulses provided to said stepping motor means.

19. The fault isolation system as recited in claim 18 including eleventh means coupled to said tenth means and to said stepping motor means for stopping the X and Y travel of said second means when said eleventh means has counted said predetermined number of digital pulses.

20. The fault isolation system as recited in claim 19 including twelfth means in said second means for causing motion in a Z direction of said second means, said Z direction being perpendicular to said X and Y directions.

* * * * *

UNITED STATES PATENT OFFICE
CERTIFICATE OF CORRECTION

PATENT NO. : 4,012,625
DATED : March 15, 1977
INVENTOR(S) : Russell H. Bowen, et al It is certified that error appears in the above-identified patent and that said Letters Patent are hereby corrected as shown below:

Column 22, line 25, delete "electrode" and insert "electrical".

Signed and Sealed this

Thirteenth Day of September 1977

[SEAL]

Attest:

RUTH C. MASON
Attesting Officer

LUTRELLE F. PARKER
Acting Commissioner of Patents and Trademarks